United States Patent
Maeda et al.

(10) Patent No.: US 7,675,956 B2
(45) Date of Patent: Mar. 9, 2010

(54) VERTICAL CAVITY SURFACE EMITTING LASER AND METHOD FOR MANUFACTURING THE SAME

(75) Inventors: Osamu Maeda, Kanagawa (JP); Masaki Shiozaki, Kanagawa (JP); Norihiko Yamaguchi, Kanagawa (JP); Yoshinori Yamauchi, Tokyo (JP); Takahiro Arakida, Kanagawa (JP)

(73) Assignee: Sony Corporation, Tokyo (JP)

( * ) Notice: Subject to any disclaimer, the term of this patent is extended or adjusted under 35 U.S.C. 154(b) by 116 days.

(21) Appl. No.: 12/076,791

(22) Filed: Mar. 24, 2008

(65) Prior Publication Data

US 2008/0240194 A1    Oct. 2, 2008

(30) Foreign Application Priority Data

Mar. 27, 2007   (JP)   ............... 2007-081153

(51) Int. Cl.
    *H01S 5/00*   (2006.01)
(52) U.S. Cl. .............. 372/50.124; 372/46.013
(58) Field of Classification Search ............ 372/46.013, 372/50.124
    See application file for complete search history.

(56) References Cited

U.S. PATENT DOCUMENTS

| | | | |
|---|---|---|---|
| 7,244,629 B2 * | 7/2007 | Ezaki et al. ................... 438/39 |
| 2002/0101899 A1 * | 8/2002 | Yokouchi et al. .............. 372/46 |
| 2004/0120376 A1 * | 6/2004 | Kwak ........................... 372/45 |
| 2006/0013276 A1 * | 1/2006 | McHugo ................ 372/50.124 |
| 2007/0091961 A1 * | 4/2007 | Lin et al. ............... 372/50.124 |

FOREIGN PATENT DOCUMENTS

| JP | 2891133 | 7/1996 |
|---|---|---|
| JP | 2001-525995 | 12/2001 |

* cited by examiner

*Primary Examiner*—Armando Rodriguez
(74) *Attorney, Agent, or Firm*—Rader, Fishman & Grauer PLLC

(57) ABSTRACT

A Vertical Cavity Surface Emitting Laser capable of being easily and inexpensively manufactured and stabilizing the polarization direction of laser light in one direction is provided. The VCSEL includes a semiconductor lamination structure including a first multilayer film reflector, an active layer having a light emitting region, and a second multilayer film reflectors, in this order over a substrate from the substrate side. The semiconductor lamination structure has a pair of grooves provided with a region opposed to the light emitting region in between, and one or a plurality of first oxidation layers including a first non-oxidation region provided at least in a region opposed to the light emitting region and a first oxidation region provided on each side face of the pair of grooves.

35 Claims, 16 Drawing Sheets

VERTICAL CAVITY SURFACE EMITTING LASER AND METHOD FOR MANUFACTURING THE SAME

CROSS REFERENCES TO RELATED APPLICATIONS

The present invention contains subject matter related to Japanese Patent Application JP 2007-081153 filed in the Japanese Patent Office on Mar. 27, 2007, the entire contents of which are incorporated herein by reference.

BACKGROUND OF THE INVENTION

1. Field of the Invention

The present invention relates to a Vertical Cavity Surface Emitting Laser (VCSEL) that emits a laser light from the top face and a method of manufacturing the same.

2. Description of the Related Art

A VCSEL emits light in the direction orthogonal to a substrate differently from the existing edge-emitting laser diodes. In the VCSEL, many devices can be arranged in a state of a two-dimensional array on the same substrate. Therefore, the VCSEL has recently attracted attention as a light source for a digital copy machine or a printer.

In the past, in the foregoing type of VCSEL, a pair of multilayer film reflectors was formed over the semiconductor substrate, and an active layer becoming a light emitting region was provided between the pair of multilayer film reflectors. Between one of the multilayer film reflectors and the active layer, to improve efficiency of current injection into the active layer and lower the threshold value current, a current confinement layer having a structure in which a current injection region was confined is provided. Further, a lower electrode was provided on the bottom face side, and an upper electrode was provided on the top face side. The upper electrode was provided with an aperture to emit laser light. In the VCSEL, a current was confined by the current confinement layer injected into the active layer where light is emitted. While the emitted light repeated the reflection between the pair of multilayer film reflectors, the light was emitted as laser light from the aperture of the upper electrode.

In general, the foregoing VCSEL has issues, such as non-uniformity in which the polarization direction varies due to the variation of devices and instability in which the polarization direction is changed depending on the output and the ambient temperature. Therefore, in the case where such a VCSEL is applied to an optical device with polarization dependence, such as a mirror and a beam splitter, for example, if the VCSEL is used as a light source for a digital copy machine and a printer, there is an issue that the variation in the polarization direction causes a difference in the image location of an image and the output, leading to blur and irregular color.

Therefore, to solve the foregoing issue, a plurality of techniques for providing a polarization control function inside the VCSEL to stabilize the polarization direction in one direction has been reported.

For example, as one of such techniques, there is a technique using a high-angle inclined substrate with a normal line of (311) plane (GaAs inclined substrate). A VCSEL device structured by using such a high-angle inclined substrate has gain property for [−233] direction, and thus the polarization direction of laser light is able to be controlled in this direction. Further, in this case, the polarization ratio of laser light is very high, and therefore this technique is effective for stabilizing the polarization direction of the VCSEL device in one direction.

Further, Japanese Patent Publication No. 2891133 discloses a technique for narrowing the width of one plane in one in-plane direction of a mesa to the degree that light is subject to a diffraction loss on the side face of the mesa, thereby obtaining polarization parallel to the side face.

Further, Japanese Patent Application Publication No. 2001-525995 discloses a technique for forming a discontinuous section in part of the metal contact layer that does not affect the characteristics of laser light emitted from a light emitting aperture, and obtaining polarization parallel to the boundary of the discontinuous section.

SUMMARY OF THE INVENTION

However, the foregoing high-angle inclined substrate is a special substrate with a normal line of the (311) plane. Therefore, the high-angle inclined substrate is very expensive compared to standard substrates, such as a (001) plane substrate. Further, in the case of using such a high-angle inclined substrate, epitaxial growth conditions, such as growth temperature, doping conditions, and gas flow, are totally different from those of a case using the (001) plane substrate. Therefore, it is difficult to manufacture such a high-angle inclined substrate.

In the technique of the foregoing Japanese Patent Publication No. 2891133, the diameter of the mesa is very small. Thus, the resistance of the vertical resonator is increased. Further, since the output of laser light is low, about 1 mW, this is not a practical output as a light source for a digital copy machine or a printer. Furthermore, if laser light is emitted from the substrate side, it is necessary to etch the GaAs substrate to the vicinity of a DBR layer to suppress laser absorption by the GaAs substrate, and thus the manufacturing steps become complicated. Moreover, since the diameter of the mesa is small, there is a possibility of the mesa breaking in the manufacturing process, and thus it is not easy to manufacture the device stably.

Further, in the foregoing Japanese Patent Application Publication No. 2001-525995, as an example, a VCSEL in which a groove (discontinuous section) that is 4.0 to 4.5 μm deep is formed in a position 7 μm apart from the edge of the light emitting aperture is described. Descriptions are therein given in which polarization parallel to the groove could be thereby obtained. However, the polarization direction may not be stabilized in one direction unless the width of the short side of the resonance region is reduced down to the degree at which diffraction loss effects are generated. Therefore, depending on the discontinuous section formed in the range at which diffraction loss effects may not be obtained (width of the short side is 7 μm), stabilization does not seem to be realized. Further, assuming that such stabilization of the polarization direction is an effect resulting from a stress or strain due to forming the groove, there is a possibility of an affect of a stress from other factors applied to the device in the crystal growth and the formation process.

As described above, in the related art, it has been difficult to manufacture a VCSEL device with ease, capable of stabilizing the polarization direction of laser light in one direction.

In view of the foregoing, in the invention, it is desirable to provide a VCSEL capable of being manufactured easily and inexpensively, while stabilizing the polarization direction of laser light in one direction and a method of manufacturing the VCSEL.

According to an embodiment of the invention, there is provided a first VCSEL having a semiconductor lamination structure including a first multilayer film reflector, an active layer having a light emitting region, and a second multilayer film reflector, in this order over a substrate from the substrate side. The semiconductor lamination structure has a pair of grooves and one or more of the first oxidation layers. The pair of grooves is provided with a region opposed to the light emitting region in between. The first oxidation layer includes a first non-oxidation region provided at least in a region opposed to the light emitting region and a first oxidation region provided on each side face of the pair of grooves.

Any layers may be inserted either between the substrate and the first multilayer film reflector, between the first multilayer film reflector and the active layer, between the active layer and the second multilayer film reflector, in the first multilayer film reflector, or in the second multilayer film reflector. The same is applied to a second and a third VCSELs.

In the first VCSEL of the embodiment of the invention, the pair of grooves is provided with the region opposed to the light emitting region in between. Thereby, the polarization component in the opposing direction of the pair of grooves is subject to light loss, while the polarization component in the direction orthogonal to the opposing direction of the pair of grooves is hardly subject to light loss. Further, in the embodiment of the invention, the first oxidation region is provided on each side face of the pair of grooves. That is, the first oxidation region is distributed in the opposing direction of the pair of grooves centering on the region opposed to the light emitting region. Therefore, a tension strain is generated in the opposing direction of the pair of grooves in the region opposed to the light emitting region of the first oxidation layer. Thereby, a tension stress according to the magnitude of the tension strain is given to the light emitting region. In the result, the polarization component in the direction orthogonal to the tension stress direction (direction orthogonal to the opposing direction of the pair of grooves) is intensified. Meanwhile, the polarization component in the direction parallel to the tension stress direction (opposing direction of the pair of grooves) is suppressed. Consequently, in the embodiment of the invention, due to two actions by the pair of grooves and the first oxidation region, the polarization component of laser light is fixed in one direction (direction orthogonal to the opposing direction of the pair of grooves). The substrate is not necessarily a special substrate, such as an (n11) plane substrate (n is an integer number), but may be a (011) plane substrate.

According to an embodiment of the invention, there is provided a second VCSEL having a semiconductor lamination structure including a first multilayer film reflector, an active layer having a light emitting region, and a second multilayer film reflector, in this order over a substrate from the substrate side, and an insulating layer. The semiconductor lamination structure has a pair of grooves provided with a region opposed to the light emitting region in between. The insulating layer is provided in all or part of an internal wall of the groove, and gives a tension stress in an opposing direction of the pair of grooves to the light emitting region.

In the second VCSEL, according to the embodiment of the invention, the pair of grooves is provided with the region opposed to the light emitting region in between. Thereby, the polarization component in the opposing direction of the pair of grooves is subject to light loss, while the polarization component in the direction orthogonal to the opposing direction of the pair of grooves is hardly subject to light loss. Further, in the embodiment of the invention, the insulating layer is provided on all or part of the internal wall of the groove. Thus, a tension stress is given to the light emitting region in the opposing direction of the pair of grooves. Thereby, the polarization component in the direction orthogonal to the tension stress direction (direction orthogonal to the opposing direction of the pair of grooves) is intensified. Meanwhile, the polarization component in the direction parallel to the tension stress direction (opposing direction of the pair of grooves) is suppressed. Consequently, in the embodiment of the invention, due to two actions by the pair of grooves and the insulating layer, the polarization component of laser light is fixed in one direction (direction orthogonal to the opposing direction of the pair of grooves). The substrate is not necessarily a special substrate, such as an (n11) plane substrate (n is an integer number), but may be a (011) plane substrate.

According to an embodiment of the invention, there is provided a third VCSEL having a semiconductor lamination structure including a first multilayer film reflector, an active layer having a light emitting region, and a second multilayer film reflector, in this order over a substrate from the substrate side, and a metal layer. The semiconductor lamination structure has a pair of grooves provided with a region opposed to the light emitting region in between. The metal layer is provided in all or part of an internal wall of the groove, and gives a tension stress in an opposing direction of the pair of grooves to the light emitting region.

In the third VCSEL, according to an embodiment of the invention, the pair of grooves is provided with the region opposed to the light emitting region in between. Thereby, the polarization component in the opposing direction of the pair of grooves is subject to light loss, while the polarization component in the direction orthogonal to the opposing direction of the pair of grooves is hardly subject to light loss due to the pair of the grooves. Further, in the embodiment of the invention, the metal layer is provided on all or part of the internal wall of the groove. Thus, a tension stress is given to the light emitting region in the opposing direction of the pair of grooves. Thereby, the polarization component in the direction orthogonal to the tension stress direction (direction orthogonal to the opposing direction of the pair of grooves) is intensified. Meanwhile, the polarization component in the direction parallel to the tension stress direction (opposing direction of the pair of grooves) is suppressed. Consequently, in the embodiment of the invention, due to two actions by the pair of grooves and the metal layer, the polarization component of laser light is fixed in one direction (direction orthogonal to the opposing direction of the pair of grooves). The substrate is not necessarily a special substrate, such as an (n11) plane substrate (n is an integer number), but may be a (011) plane substrate.

According to an embodiment of the invention, there is provided a method of manufacturing a VCSEL including the steps of forming a mesa having a pair of grooves by forming a semiconductor lamination structure including one or a plurality of first oxidized layers over a substrate, then forming the pair of grooves penetrating the first oxidized layer and the semiconductor lamination structure in the shape of a mesa; and forming a first oxidation region on an internal wall side of the groove in the first oxidized layer, and forming a first non-oxidation region at least between opposing faces of the pair of grooves in the first oxidized layer by oxidizing the first oxidized layer at least from the internal wall side of the groove.

In the method of manufacturing a VCSEL, according to the embodiment of the invention, the mesa having the pair of grooves is formed. Thus, it is possible that the polarization component in the opposing direction of the pair of grooves is subject to light loss, while the polarization component in the direction orthogonal to the opposing direction of the pair of grooves is hardly subject to light loss due to the pair of the grooves. Further, in the embodiment of the invention, the first oxidation region can be formed on each side face of the pair of grooves. Thereby, the first oxidation region is distributed in the opposing direction of the pair of grooves centering on the region opposed to the light emitting region. Therefore, a tension strain is generated in the opposing direction of the pair of grooves in the region opposed to the light emitting region of the first oxidation layer. Thereby, a tension stress according to the magnitude of the tension strain is given to the light emitting region. In the result, the polarization component in the direction orthogonal to the tension stress direction (direction orthogonal to the opposing direction of the pair of grooves) is intensified. Meanwhile, the polarization component in the direction parallel to the tension stress direction (opposing direction of the pair of grooves) is suppressed. Consequently, in the embodiment of the invention, due to two actions by the pair of grooves and the first oxidation region, the polarization component of laser light can be fixed in one direction (direction orthogonal to the opposing direction of the pair of grooves). The substrate is not necessarily a special substrate, such as an (n11) plane substrate (n is an integer number), but may be a (011) plane substrate.

According to the first VCSEL of the embodiment of the invention, due to two actions by the pair of grooves and the first oxidation region, the polarization component of laser light is fixed in one direction. Thus, the polarization direction of laser light can be stabilized in one direction. Further, since it is not necessary to use a special substrate, the device can be manufactured easily and inexpensively.

According to the second VCSEL of the embodiment of the invention, due to two actions by the pair of grooves and the insulating layer, the polarization component of laser light is fixed in one direction. Thus, the polarization direction of laser light is stabilized in one direction. Further, since it is not necessary to use a special substrate, the device can be manufactured easily and inexpensively.

According to the third VCSEL of the embodiment of the invention, due to two actions by the pair of grooves and the metal layer, the polarization component of laser light is fixed in one direction. Thus, the polarization direction of laser light is stabilized in one direction. Further, since it is not necessary to use a special substrate, the device can be manufactured easily and inexpensively.

According to the method of manufacturing a VCSEL of the embodiment of the invention, after the mesa having the pair of grooves is formed, the first oxidation region is formed on each side face of the pair of grooves. Thus, due to two actions by the pair of grooves and the first oxidation region, the polarization component of laser light can be fixed in one direction. Thereby, the polarization direction of laser light can be stabilized in one direction. Further, since it is not necessary to use a special substrate, the device can be manufactured easily and inexpensively.

As described above, according to the first to the third VCSELs and the method of manufacturing a VCSEL of the embodiments of the invention, the laser is manufactured easily and inexpensively, and the polarization direction of laser light is stabilized in one direction.

Other and further objects, features and advantages of the invention will appear more fully from the following description.

DETAILED DESCRIPTION OF THE PREFERRED EMBODIMENT

Descriptions will be given of an embodiment of the invention in detail with reference to the drawings.

Figure 1:
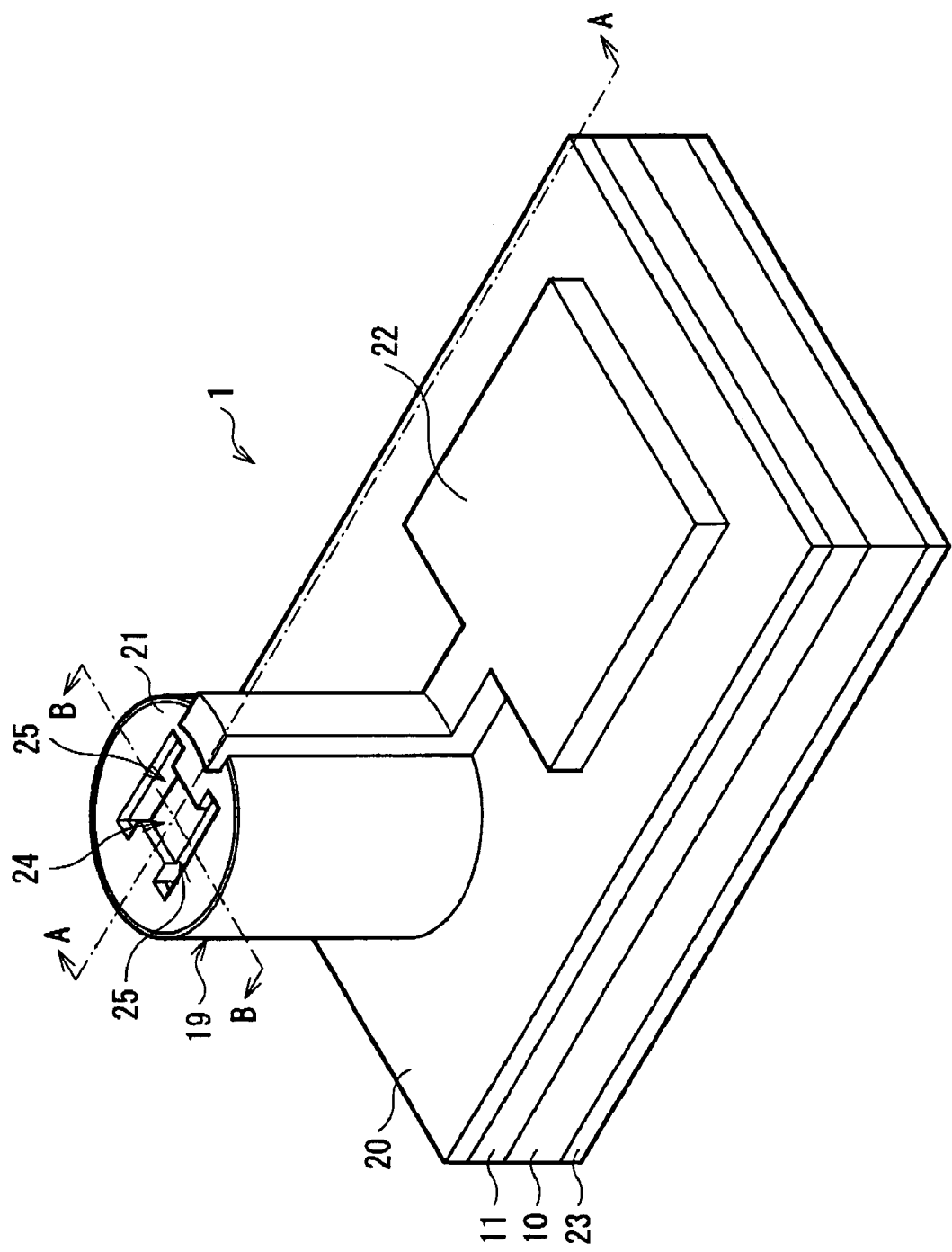
FIG. 1 is a perspective view of a VCSEL according to an embodiment of the invention.
Figure 2:
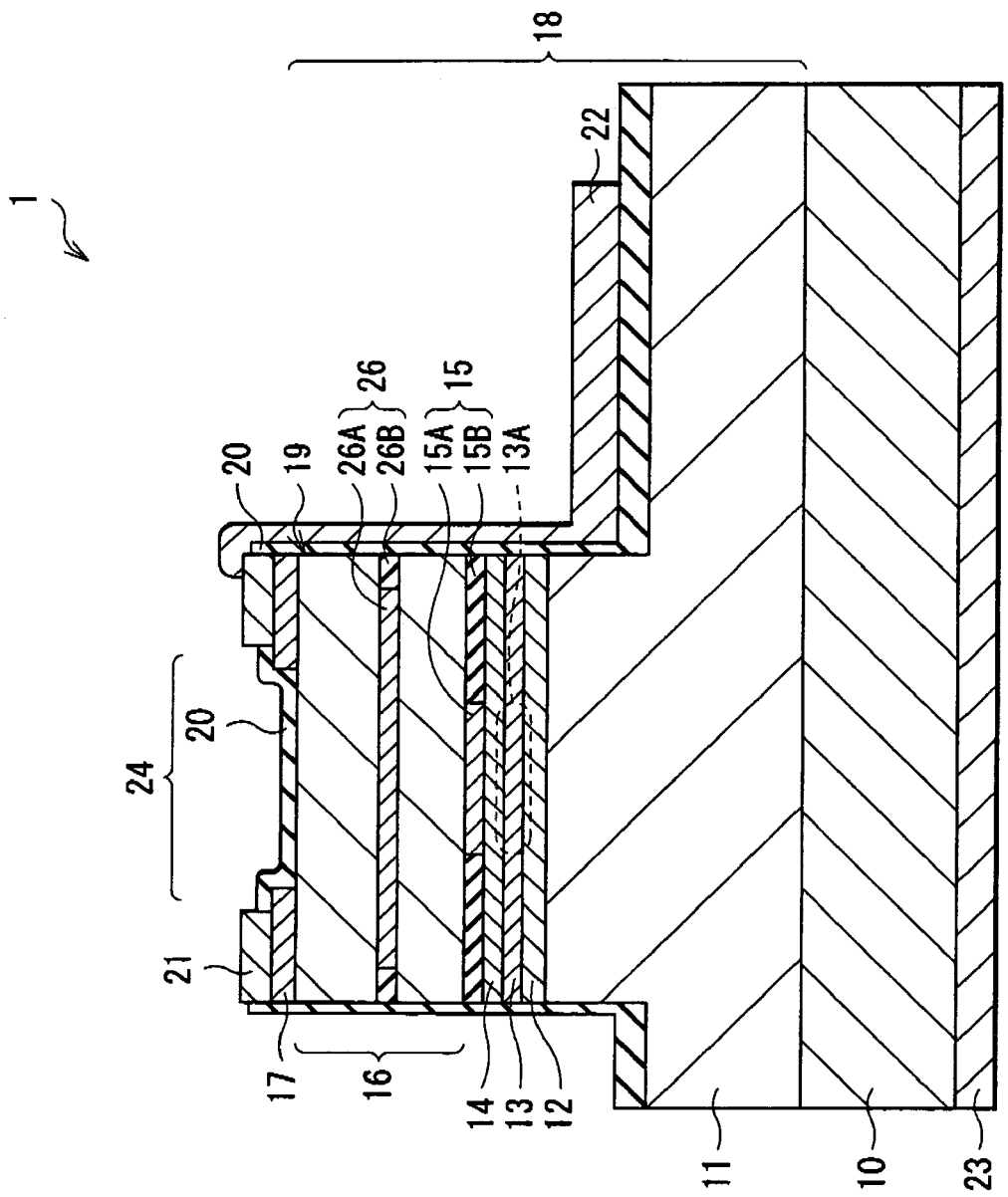
FIG. 2 is a view showing a cross sectional structure taken along arrows A-A of the laser of FIG. 1.
Figure 3:
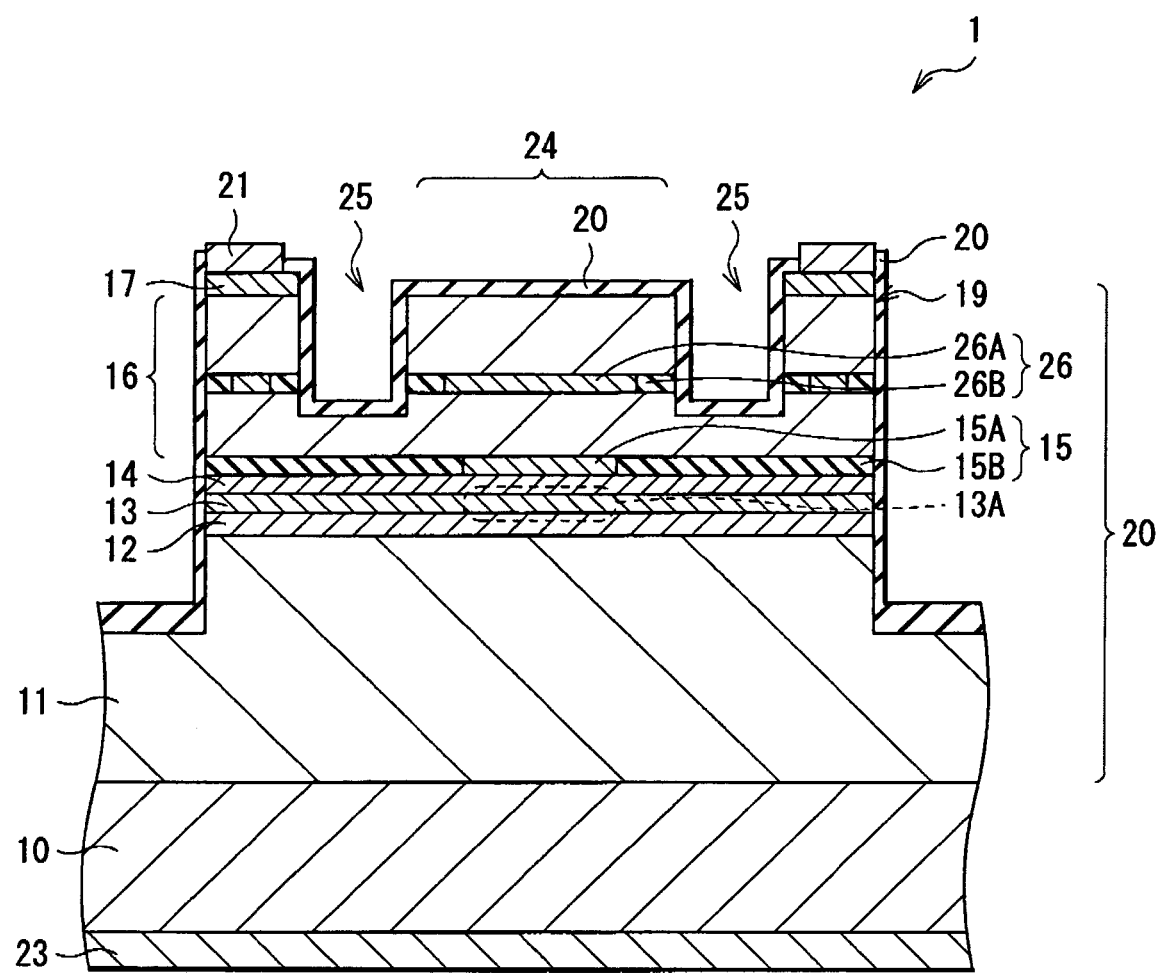
FIG. 3 is a view showing a cross sectional structure taken along arrows B-B of the laser of FIG. 1.
Figure 4:
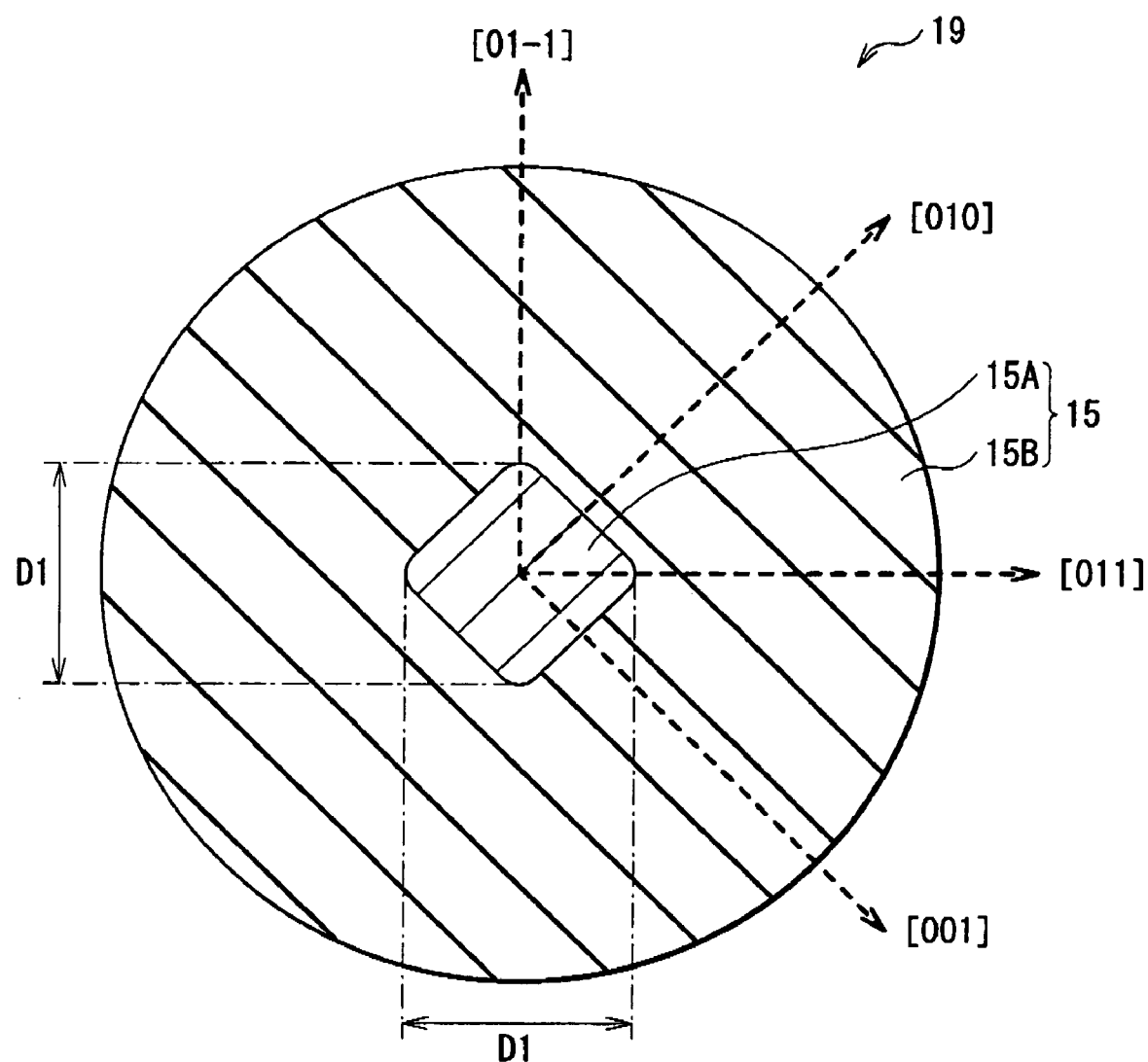
FIG. 4 is a view showing a cross sectional structure in the in-plane direction of a current confinement layer of FIG. 2.
Figure 5:
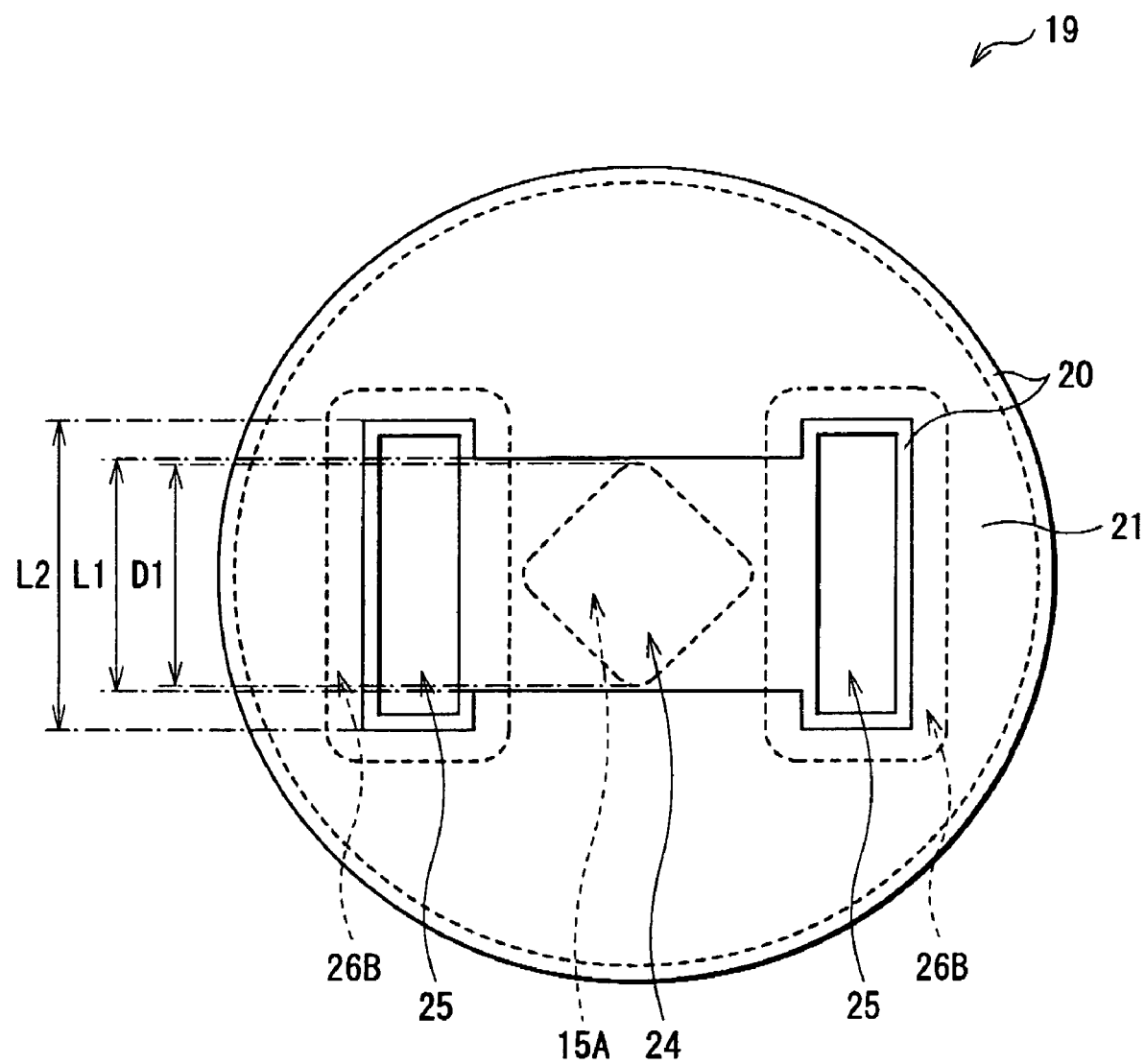
FIG. 5 is an example of a top face structure view of a mesa of FIG. 2.
Figure 6:
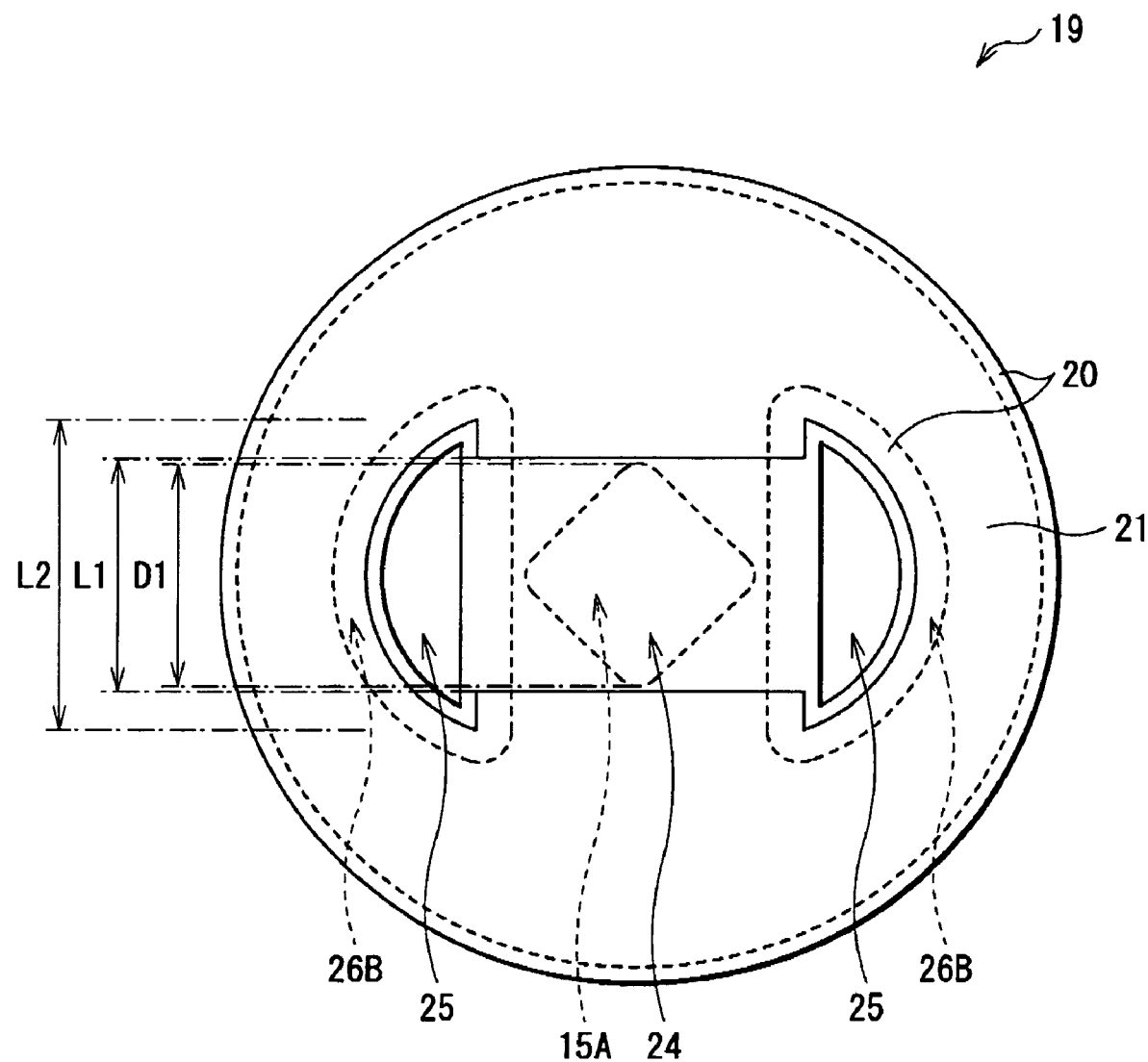
FIG. 6 is another example of a top face structure view of the mesa of FIG. 2.

FIG. 1 shows a perspective view of a VCSEL 1 according to an embodiment of the invention. FIG. 2 shows a cross sectional structure taken along arrows A-A of the VCSEL 1 of FIG. 1. FIG. 3 shows a cross sectional structure taken along arrows B-B of the VCSEL 1 of FIG. 1. FIG. 4 shows a cross sectional structure in a lamination plane of a current confinement layer 15 of FIG. 2 and FIG. 3. FIG. 5 shows an example of a top face structure of a mesa 19 of FIG. 1. FIG. 6 shows another example of a top face structure of the mesa 19 of FIG. 1. FIG. 1 to FIG. 6 are schematic views, and thus the dimensions and the shapes thereof are different from the actual dimensions and the actual shapes.

The VCSEL 1 has a semiconductor lamination structure 18 in which, for example, a lower DBR mirror layer 11 (first multilayer film reflector), a lower cladding layer 12, an active layer 13, an upper cladding layer 14, a current confinement layer 15 (second oxidation layer), an upper DBR mirror layer 16 (second multilayer film reflector), and a contact layer 17 are layered in this order over one face side of a substrate 10. The upper section of the lower cladding layer 12, the active layer 13, the upper cladding layer 14, the current confinement layer 15, the upper DBR mirror layer 16, and the contact layer 17 structure, for example, the cylindrical mesa 19, is about 20 μm to 50 μm wide.

A protective film 20 is formed on the top face (except for the outer edge) of the mesa 19, the side face of the mesa 19, and the substrate around the mesa 19 (refer to FIG. 1 to FIG. 3). An upper electrode 21 is formed on the outer edge of the top face of the mesa 19 (annular section where the protective film 20 is not formed). A pad 22 electrically connected to the upper electrode 21 is formed on the substrate around the mesa 19. A lower electrode 23 is formed on the rear face of the substrate 10.

The substrate 10, the lower DBR mirror layer 11, the lower cladding layer 12, the active layer 13, the upper cladding layer 14, the upper DBR mirror layer 16, and the contact layer 17 are respectively made of, for example, a GaAs (gallium-arsenic)-based compound semiconductor. The GaAs-based compound semiconductor means a compound semiconductor containing at least gallium (Ga) in Group 3B elements in the short period periodic table, and at least arsenic (As) in Group 5B elements in the short period periodic table.

The substrate 10 is, for example, an n-type GaAs substrate. The GaAs substrate is preferably, for example, a (100) plane substrate. However, the GaAs substrate may be a special substrate, such as a (n11) plane substrate (n is an integer number).

The lower DBR mirror layer 11 is formed by alternately layering a low-refractive index layer and a high-refractive index layer. The low-refractive index layer is composed of n-type $Al_{x1}Ga_{1-x4}As$ that is $\lambda/4n_a$ thick ($\lambda$ is an oscillation wavelength, and $n_a$ is a refractive index), for example. The high-refractive index layer is composed of n-type $Al_{x2}Ga_{1-x2}As$ that is $\lambda/4n_b$ thick ($n_b$ is a refractive index), for example. As an n-type impurity, for example, silicon (Si), selenium (Se) or the like is cited.

If the lower DBR mirror layer 11 is made of the foregoing materials, Al composition ratios x1 and x2 in the lower DBR mirror layer 11 satisfy Formula 1, as shown below. Thereby, the low-refractive index layer is more easily oxidized than the high-refractive index layer, and is oxidized equally to the current confinement layer 15, or is less oxidized than the current confinement layer 15.

Formula 1

$$1 \geq x5 > x1 > 0.8 > x2 \geq 0$$

As will be described later, x5 in Formula 1 is a value of the Al composition included in the current confinement layer 15. 0.8 in Formula 1 corresponds to the boundary between the refractive index of the low-refractive index layer and the refractive index of the high-refractive index layer.

The lower cladding layer 12 is made of, for example, $Al_{x3}Ga_{1-x3}As$ ($0 \leq x3 < 1$). The active layer 13 is made of, for example, a GaAs-based material. In the active layer 13, the region opposed to a current injection region 15A described later is a light emitting region 13A. The upper cladding layer 14 is made of, for example, $Al_{x4}Ga_{1-x4}As$ ($0 \leq x4 < 1$). Though the lower cladding layer 12, the active layer 13, and the upper cladding layer 14 do not desirably contain an impurity, the lower cladding layer 12, the active layer 13, and the upper cladding layer 14 may contain a p-type impurity or an n-type impurity. As a p-type impurity, zinc (Zn), magnesium (Mg), beryllium (Be) or the like can be cited.

As shown in FIG. 2 and FIG. 3, the current confinement layer 15 has a current confinement region 15B (oxidation region) in the outer edge region thereof, and has a current injection region 15A (non-oxidation region) in the central region thereof. The current injection region 15A is made of, for example, p-type $Al_{x5}Ga_{1-x5}As$ ($0 < x5 \leq 1$). The current confinement region 15B contains, for example, $Al_2O_3$ (aluminum oxide). As will be described later, the current confinement region 15B is obtained by oxidizing concentrated Al contained in a current confinement layer 15D from the side face of the mesa 19. Thereby, the current confinement layer 15 has a function to confine a current.

For example, as shown in FIG. 4, the current injection region 15A is in the shape of a quadrangle (for example, a diamond shape) having diagonal lines in the [011] direction and the [01-1] direction, and has in-plane anisotropy. The reason why the current confinement region 15A becomes a quadrangle having the diagonal lines in the [011] direction and the [01-1] direction is as follows. The oxidation rate of $Al_{x5}Ga_{1-x5}As$ in the [011] direction the [01-1] direction is different from that in [001] direction and [010] direction at an angle of 45 deg to [011] direction and [01-1] direction. If it is desired to suppress the higher lateral mode oscillation, the width of the current injection region 15A (length of the diagonal line) D1 is preferably 3 μm to 8 μm. If it is desired to further suppress the higher lateral mode oscillation, the width D1 is preferably 3 μm to 5 μm.

The current injection region 15A is provided in a resonator including the lower DBR mirror layer 11 and the upper DBR mirror layer 16. Thus, in the case where the current injection region 15A has the in-plane anisotropy as described above, a light gain size varies according to the size of the width in the diameter direction of the current injection region 15A. Thereby, for example, the polarization component of emitted light is polarized into the diagonal line directions of the quadrangle, that is, into the [011] direction and the [01-1] direction. In this case, the current injection region 15A also has a function to control the polarization component of emitted light.

The current injection region 15A may have a shape different from the quadrangle, for example, a circle. However, in this case, since the current injection region 15A does not have the in-plane anisotropy, and the current injection region 15A does not have the function to control the polarization component of emitted light.

The upper DBR mirror layer 16 is formed by alternately layering a low-refractive index layer and a high-refractive index layer. The low-refractive index layer is formed from a p-type $Al_{x6}Ga_{1-x6}As$ that is $\lambda/4n_c$ thick ($n_c$ is a refractive index), for example. The high-refractive index layer is formed from a p-type $Al_{x7}Ga_{1-x7}As$ that is $\lambda/4n_d$ thick ($n_d$ is a refractive index), for example.

If the upper DBR mirror layer 16 is made of the foregoing material, Al composition ratios x6 and x7 in the upper DBR mirror layer 16 satisfy Formula 2 as below. Thereby, the low-refractive index layer is more easily oxidized than the high-refractive index layer and is oxidized equally to the current confinement layer 15, or is less oxidized than the current confinement layer 15.

Formula 2

$$1 \geq x5 > x6 > 0.8 > x7 \geq 0$$

In a region of the upper DBR mirror layer 16, which includes a region corresponding to the current injection region 15A, a light emitting aperture 24, and a pair of trenches (grooves) 25 and 25 are provided (refer to FIG. 1, FIG. 3, and FIG. 5). The light emitting aperture 24 is provided in the region including the region corresponding to at least one diagonal line in the quadrangular current injection region 15A. The pair of trenches 25 and 25 are oppositely arranged with the light emitting aperture 24 in between. For example, the opposed faces of the pair of trenches 25 and 25 are arranged to be orthogonal to the extending direction ([011] direction in FIG. 4) of the diagonal line corresponding to the light emitting aperture 24. As shown in FIG. 3, the trench 25 has a bottom face in the upper DBR mirror layer 16 and a depth in which the bottom does not reach the current confinement layer 15.

As will be described later, the width of the light emitting aperture 24, that is, a width D2 between the opposed faces of the pair of trenches 25 and 25, is not particularly limited by the relation with the width D1 of the current injection region 15A, in the case in which light loss due to an oxidation region 26B of a polarization control layer 26 is desired and willingly used. However, in the case in which the light loss due to the oxidation region 26B of the polarization control layer 26 is desirably avoided, the width D2 is preferably wider than the width D1 of the current injection region 15A.

By oppositely arranging the trenches 25 and 25 with a given distance between as above, the opposed faces of the trenches 25 and 25 can bring about the light loss effect on light in the direction orthogonal to the opposed faces. Thereby, for example, in the polarization components polarized in the diagonal line directions of the current injection region 15A, the polarization component in the diagonal line direction parallel to the opposed faces ([01-1] direction of FIG. 4) is intensified, while the polarization component in the diagonal line direction orthogonal to the opposed faces ([011] direction of FIG. 4) is suppressed. As a result, the polarization component of emitted light is fixed in one direction (direction parallel to the opposed faces).

Although the cross sectional shape in the lamination plane of the trench 25 is a quadrangle in FIG. 1 and FIG. 5, the cross sectional shape thereof may be another shape, such as a semicircle shown in FIG. 6. A width L1 parallel to the opposed faces of the pair of trenches 25 and 25 of the light emitting aperture 24 is preferably shorter than a width L2 of the opposed faces of the pair of trenches 25 and 25. Thereby, for the light in the direction orthogonal to the opposed faces of the trenches 25 and 25, a loss effect can be evenly provided in the direction orthogonal to the opposed faces of the trenches 25 and 25.

The contact layer 17 is made of, for example, p-type GaAs with an aperture shape of a square in the region opposed to the foregoing light emitting aperture 24.

The protective film 20 is formed from, for example, an oxide (silicon oxide or the like), a nitride (silicon nitride or the like), polyimide or the like. The protective film 20 is formed to cover at least the peripheral edge of the contact layer 17, the side face of the mesa 19, and the vicinity thereof. The protective film 20 may be formed to further cover the internal wall of the trench 25. A material for covering the internal wall of the trench 25 may be different from a material for covering the peripheral edge of the contact layer 17, the side face of the mesa 19, and the vicinity thereof.

In the case where the protective film 20 covers the internal wall of the trench 25, the material for covering the internal wall of the trench 25 is preferably a material having light absorption effects. For example, in addition to the above-described oxide (silicon oxide or the like), nitride (silicon nitride or the like), polyimide or the like, or a metal material (such as gold (Au), platinum (Pt), nickel (Ni), gold germanium (AuGe), gold zinc (AuZn), chromium gold (CrAu), titanium (Ti), or aluminum (Al)) may be used. If the internal wall of the trench 25 is covered with the material having light absorption effects as above, the polarization component orthogonal to the opposed faces of the pair of trenches 25 and 25 is absorbed, with the polarization component in such a direction possibly lost, and the polarization ratio of emitted light may be increased. the entire internal face of the trench 25 is preferably covered with the protective film 20. In such a case, the upper DBR mirror layer 16 is protected, the polarization component orthogonal to the opposed faces of the pair of trenches 25 and 25 is prevented from leaking outside, and the radiation of light can be prevented.

Instead of the viewpoint of protecting the upper DBR mirror layer 16, from the viewpoint of light loss effects, the protective film 20 is preferably formed on at least one of the bottom face and the opposed faces of the internal face of the trench 25. For example, if a protective film 20 that is about 0.5 µm or more thick is formed on the bottom face, the polarization ratio may be increased.

Further, it is possible that a metal material that is easily ohmic-contacted with the upper electrode 21 (for example, gold zinc (AuZn)) is filled in the internal face of the trench 25 to obtain electrical connection with the upper electrode 21. In this case, a current injected from the upper electrode 21 is injected into the active layer 13 via the protective film 20 formed on the internal face of the trench 25. Thereby, the serial resistance of the upper DBR mirror layer 16 may be more decreased.

The upper electrode 21 is structured by layering, for example, a titanium (Ti) layer, a platinum (Pt) layer, and a gold (Au) layer in this order. The upper electrode 21 appears to be electrically connected to the contact layer 17. Further, in the upper electrode 21, an aperture is provided in the region corresponding to the foregoing aperture of the contact layer 17. Seen from the light axis direction of laser light, it appears that one aperture composed of the apertures of the contact layer 17 and the upper electrode 21 is provided in the upper part of the mesa 19. However, it is not necessary that the apertures of the contact layer 17 and the upper electrode 21 have the identical internal diameters. For example, the internal diameter of the aperture of the upper electrode 21 may be larger than that of the contact layer 17.

The pad 22 is structured by layering, for example, a Ti layer, a Pt layer, and a Au layer in this order, and is flat-shaped having a surface area large enough for wire bonding. The lower electrode 23 has a structure in which, for example, an alloy layer of gold (Au) and germanium (Ge), a nickel (Ni) layer, and a gold (Au) layer are layered in this order from the substrate 10 side. The lower electrode 23 is electrically connected to the substrate 10.

Figure 7:
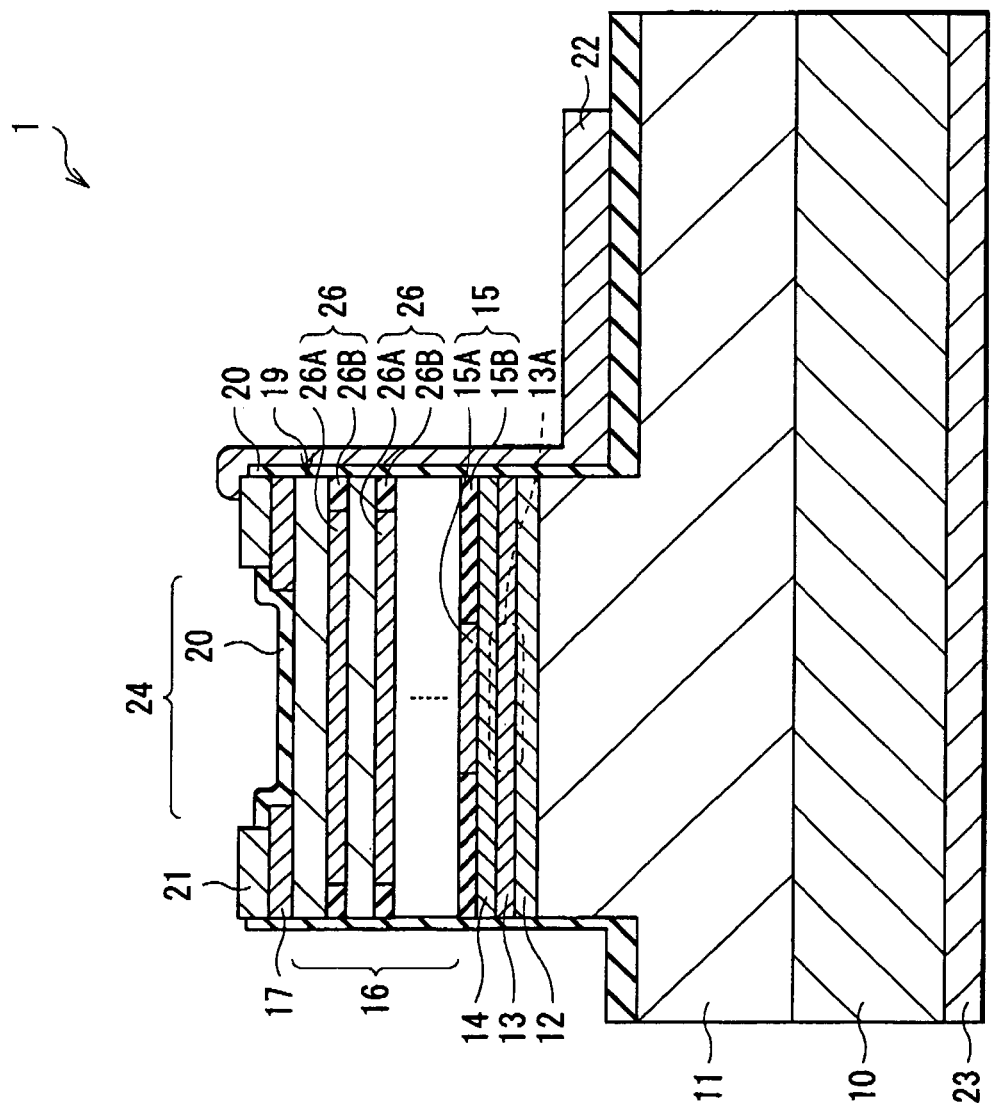
FIG. 7 is a view showing a cross sectional structure taken along arrows A-A of a VCSEL according to a modification.
Figure 8:
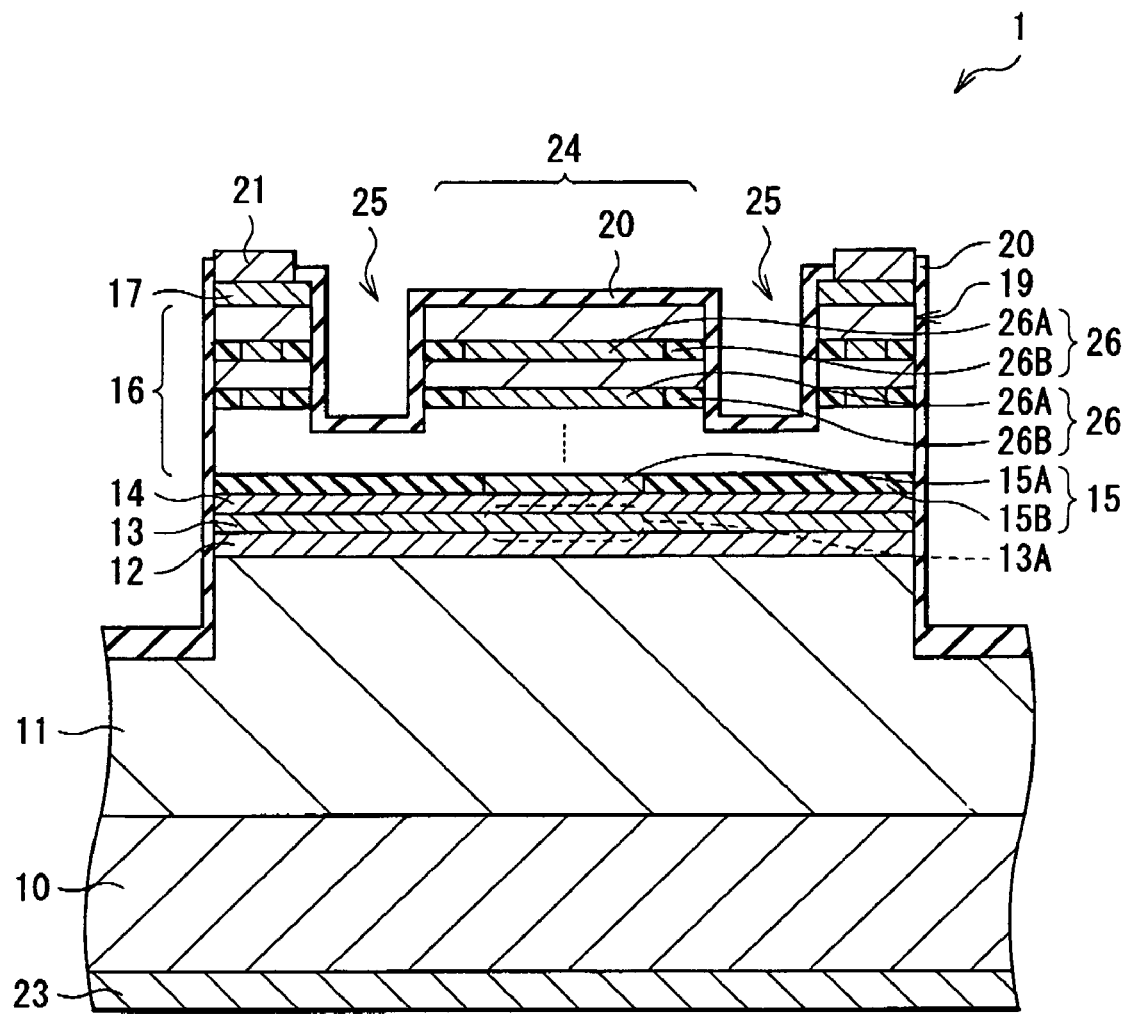
FIG. 8 is a view showing a cross sectional structure taken along arrows B-B of the VCSEL of FIG. 7.

In this embodiment, in all or part of the plurality of low-refractive index layers in the upper DBR mirror layer 16, the polarization control layer 26 (first oxidation layer) is provided instead of the low refractive layer. Only one polarization control layer 26 may be provided in the upper DBR mirror layer 16, as shown in FIG. 2 and FIG. 3, or a plurality of polarization control layers 26 may be provided in the upper DBR mirror layer 16, as shown in FIG. 7 and FIG. 8.

Figure 9:
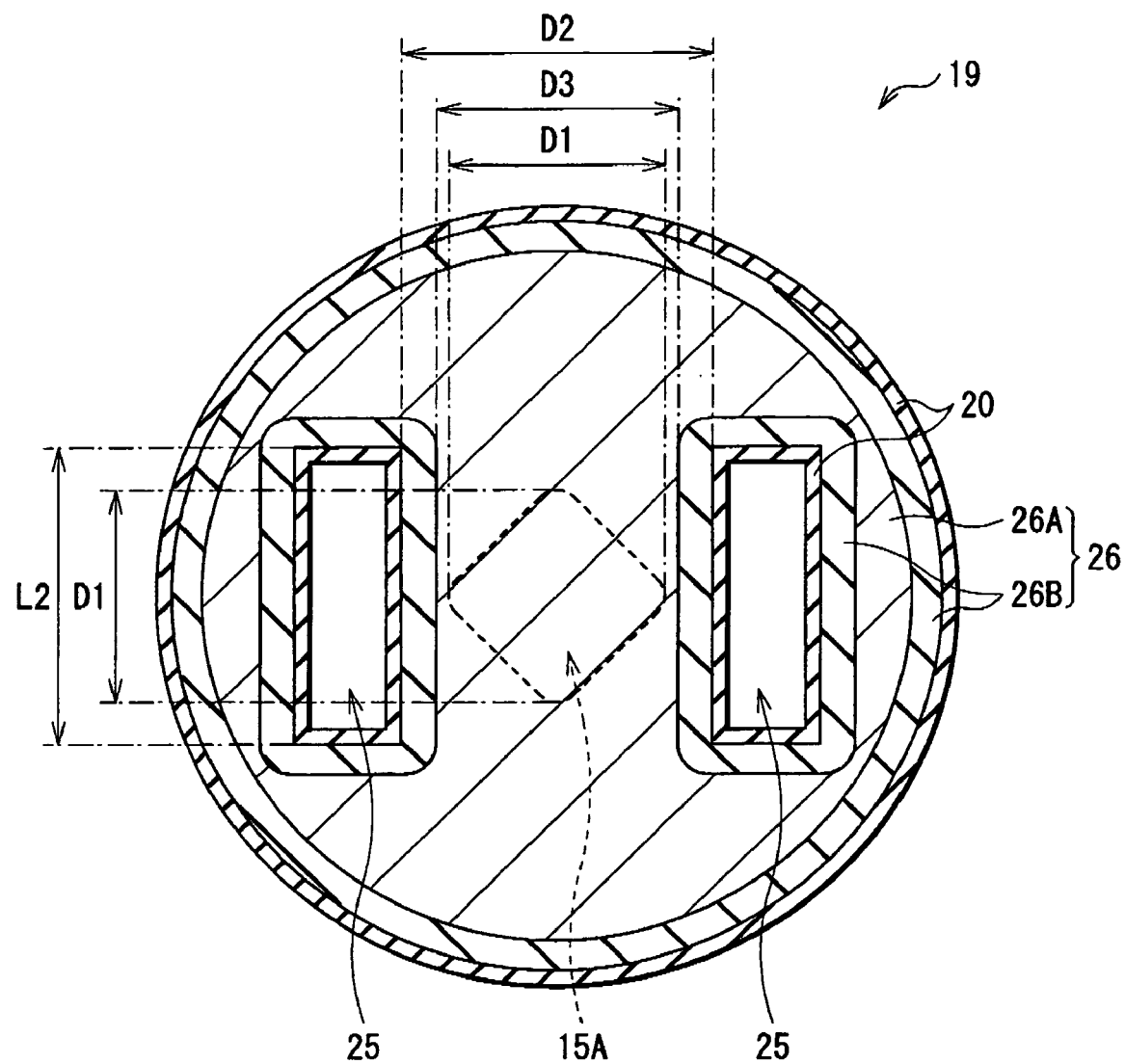
FIG. 9 is a view showing a cross sectional structure in the in-plane direction of a polarization control layer of FIG. 2.

As shown in FIG. 9, the polarization control layer 26 has the oxidation region 26B provided along the side wall of the trench 25 and the outer edge of the mesa 19 and a non-oxidation region 26A provided in the region other than the oxidation region 26B in the plane including the oxidation region 26B. That is, the polarization control layer 26 is provided in the low-refractive index layer in the layer in which the trench 25 is formed in the upper DBR mirror layer 16. FIG. 9 shows a cross sectional structure in the case in which the mesa 19 is cut in the lamination plane direction.

The non-oxidation region 26A is made of, for example, p-type $Al_{x8}Ga_{1-x8}As$. The oxidation region 26B contains, for example, $Al_2O_3$ (aluminum oxide). As will be described later, the oxidation region 26B is obtained by oxidizing concentrated Al contained in a polarization control layer 26D at least from the internal wall of the trench 25.

In the case in which light loss due to the oxidation region 26B is desired and willingly used, width D3 of the portion between the oxidation region 26B in the non-oxidation region 26A is preferably smaller than the width D1 of the current injection region 15A. On the contrary, in the case in which the light loss due to the oxidation region 26B is desirably avoided, the width D3 is preferably equal to or larger than the width D1 of the current injection region 15A (for example, about 1 μm larger than the width D1) (refer to FIG. 9). Further, as will be described later, the oxidation region 26B is formed by oxidation treatment from the internal wall side of the trench 25, and thus the width D3 is smaller than the width D2 between the opposed faces of the pair of trenches 25 and 25. As will be described later, since the oxidation region 26B is a stress source, the depth (width) from the internal wall of the trench 25 of the oxidation region 26B is preferably, 1 μm or more, and more preferably about 3 μm or more. To deliver a stress sufficient enough to realize polarization control to the active layer 13, the width D3 is preferably 10 μm or less.

In the case where the polarization control layer 26 is formed from the foregoing material and by concurrently oxidizing a current confinement layer 15D, with the polarization control layer 26D is in the manufacturing step (case A), an Al composition ratio x8 of the polarization control layer 26 satisfies the following formula (Formula 3). In the case where the polarization control layer 26 satisfies Formula 3 as above, the polarization control layer 26D is more hardly oxidized than the current confinement layer 15D. Consequently, in this case, the oxidation depth of the polarization control layer 26D is shallower than the oxidation depth of the current confinement layer 15D. To prevent the low-refractive index layer and the high-refractive index layer from being more deeply oxidized than the polarization control layer 26D in providing oxidation treatment for the polarization control layer 26D, it is necessary that the polarization control layer 26D is made of a semiconductor material that is more easily oxidized than the low-refractive index layer and the high-refractive index layer in the upper DBR mirror layer 16.

Formula 3

$$1 \geq x5 > x8 > x6$$

In the case where the polarization control layer 26 is formed from the foregoing material and by oxidizing the current confinement layer 15D, with the polarization control layer 26D in the manufacturing step different from each other (case B), the Al composition ratio x8 of the polarization control layer 26 satisfies the following formula (Formula 4). That is, in this case, since the Al composition ratio x8 is not limited by a value of the Al composition ratio x5 of the current confinement layer 15, the Al composition ratio x8 of the polarization control layer 26 may be equal to, larger than, or smaller than the Al composition ratio x5 of the current confinement layer 15. However, it is necessary to adjust the oxidation conditions (for example, the oxidation time) or the like of the polarization control layer 26D so that the oxidation depth of the polarization control layer 26D is shallower than the oxidation depth of the current confinement layer 15D. In addition, to prevent the low-refractive index layer and the high-refractive index layer from being more deeply oxidized than the polarization control layer 26D in providing oxidation treatment for the polarization control layer 26D, it is necessary that the polarization control layer 26D is made of a semiconductor material that is more easily oxidized than the low-refractive index layer and the high-refractive index layer in the upper DBR mirror layer 16.

Formula 4

$$1 \geq x8 > x6$$

The VCSEL 1 according to this embodiment can be manufactured, for example, as follows.

Figure 10A:
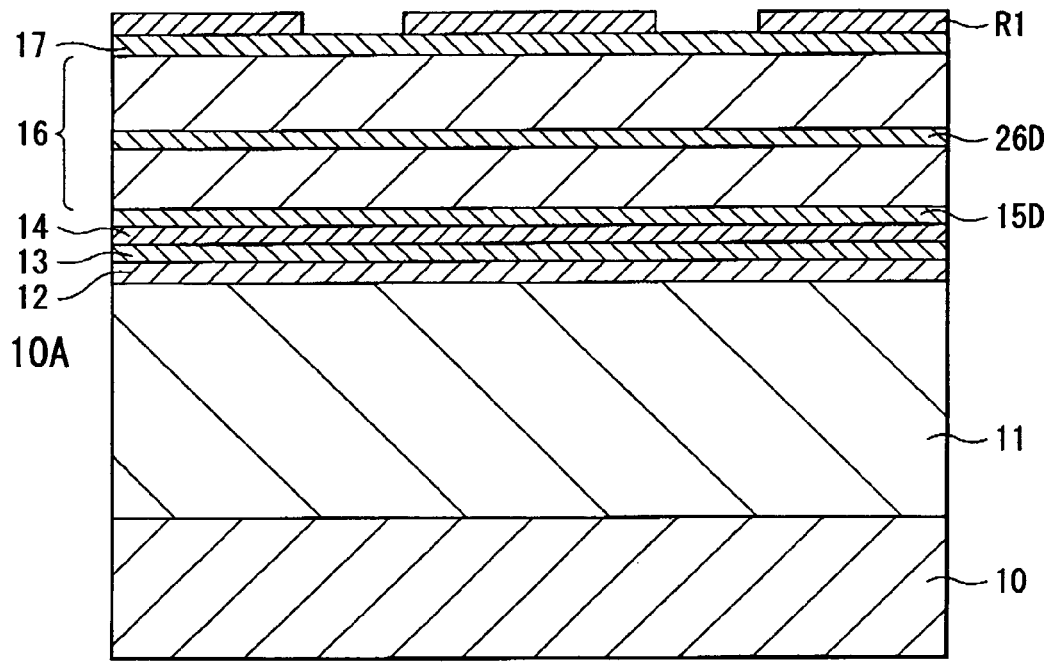
FIGS. 10A and 10B are cross sections for explaining steps of manufacturing the laser shown in FIG. 1.
Figure 10B:
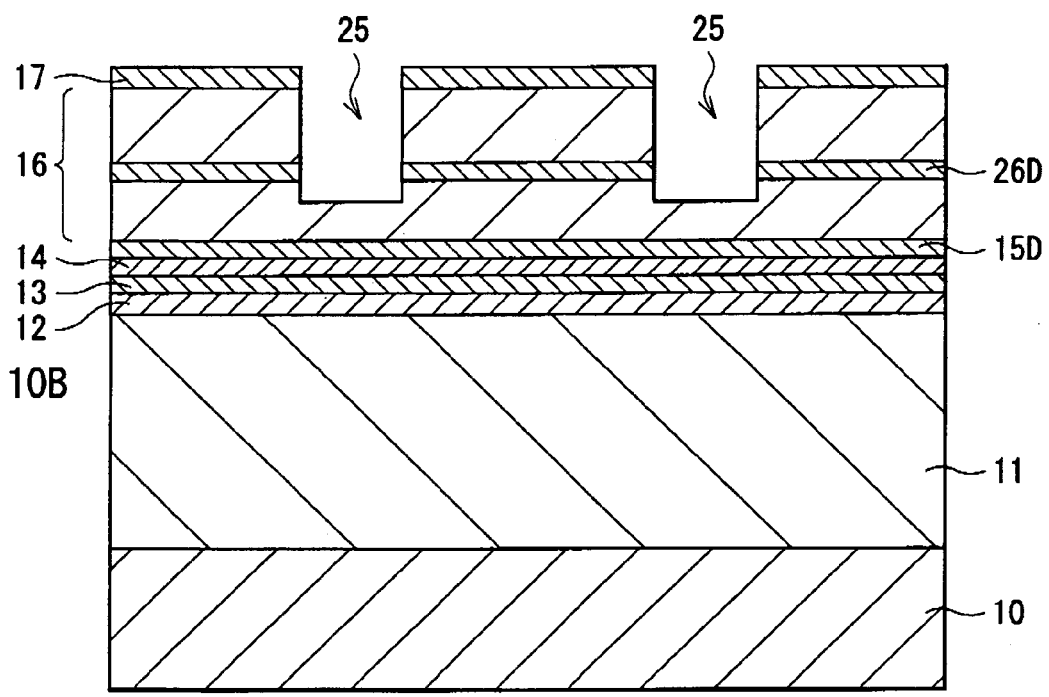
Figure 11A:
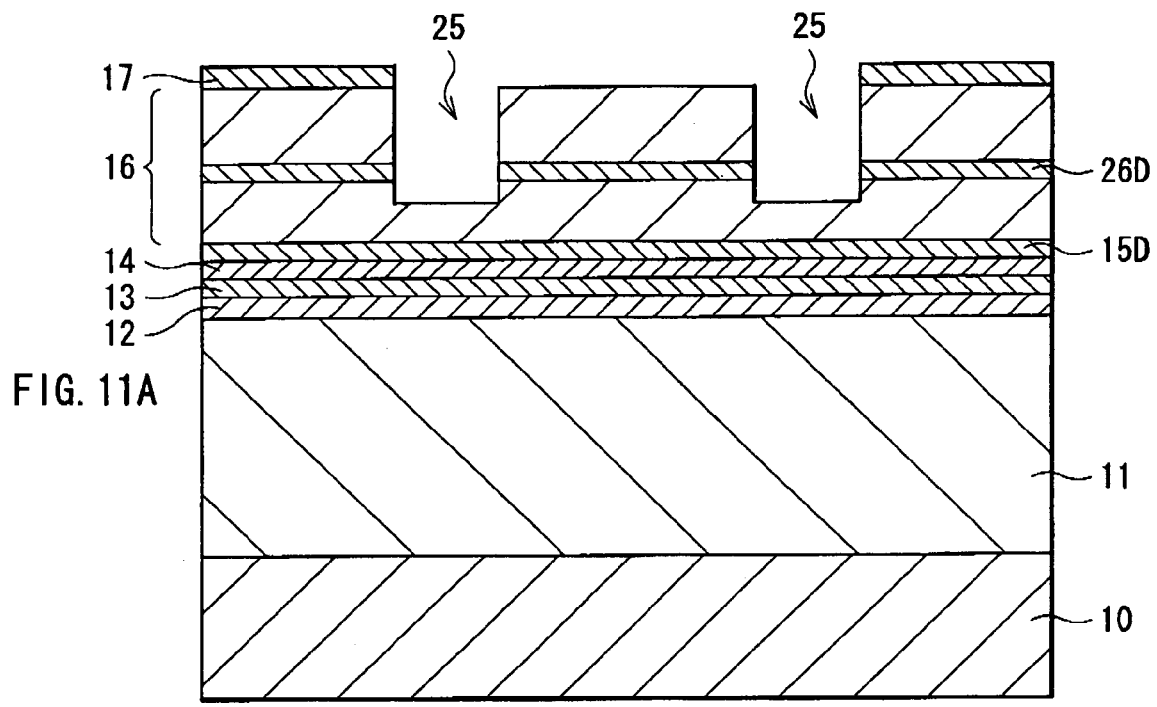
FIGS. 11A and 11B are cross sections for explaining steps following the steps of FIGS. 10A and 10B.
Figure 11B:
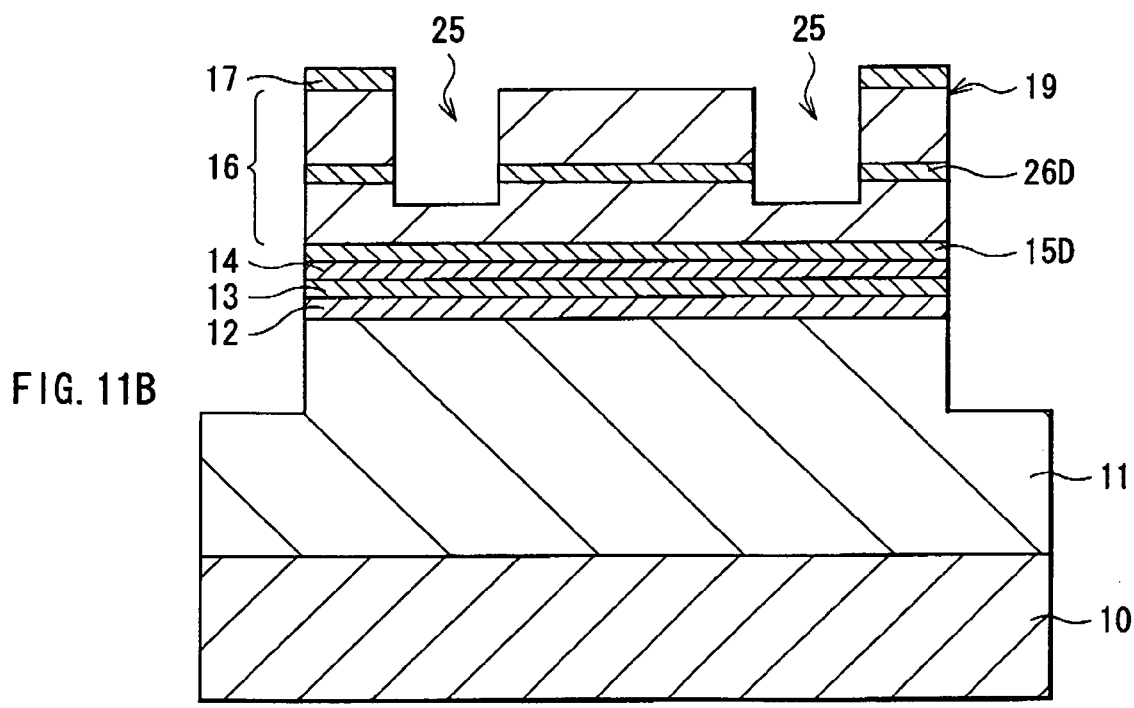
Figures 12A, 12B:
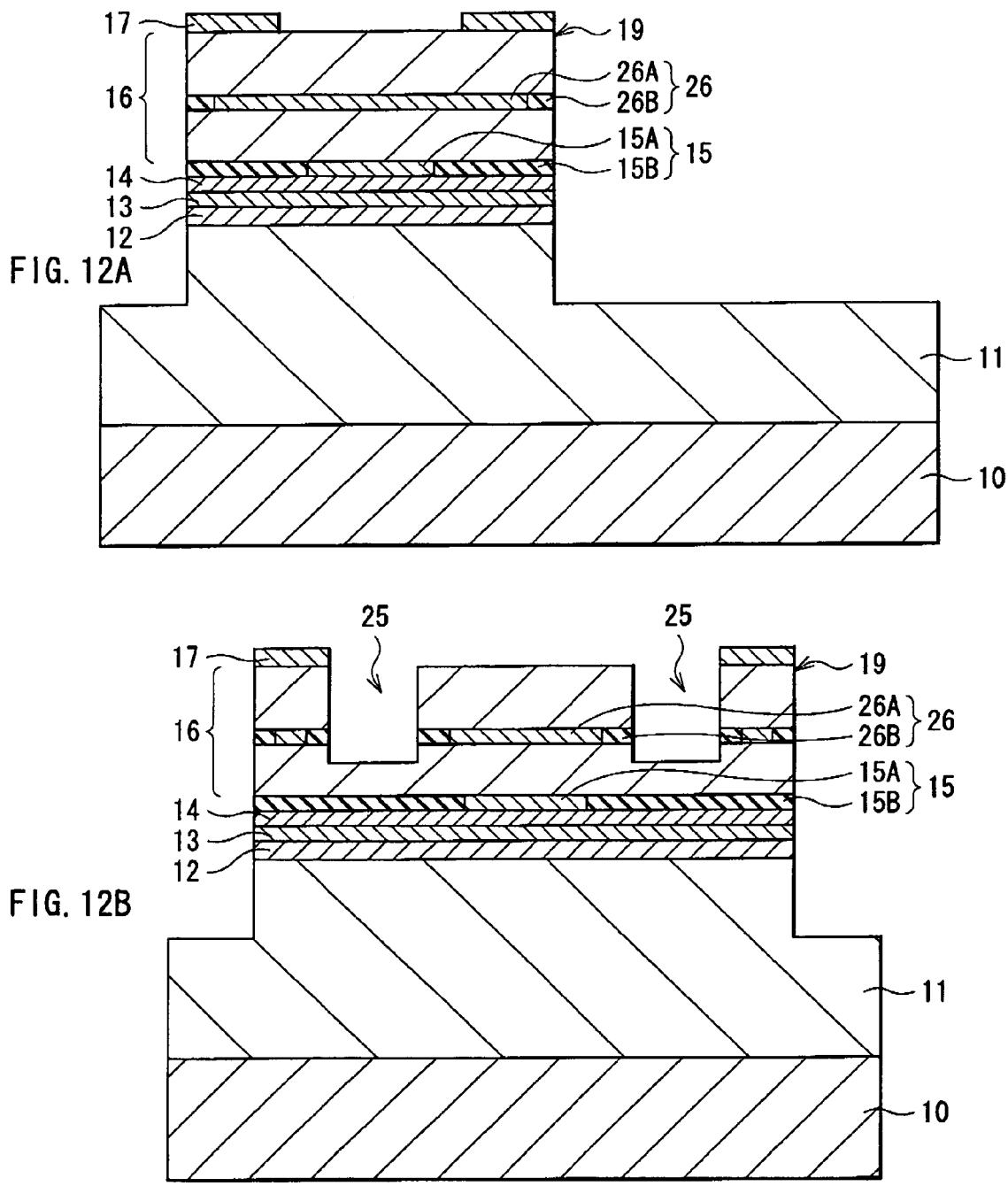
FIGS. 12A and 12B are cross sections for explaining steps following the steps of FIGS. 11A and 11B.

FIGS. 10A and 10B to FIGS. 12A and 12B show a method of manufacturing the VCSEL 1 in the order of steps. FIGS. 10A, 10B, 11A, 11B, 12A, and 12B show a structure of a cross section taken along the same direction as the direction of arrows B-B of FIG. 1 of a device in the process of manufacture. FIG. 12A shows a structure of a cross section taken along the same direction as the direction of arrows A-A of FIG. 1 of the device in the process of manufacture.

Here, the semiconductor lamination structure 18 on the substrate 10 made of GaAs is formed by the MOCVD (Metal Organic Chemical Vapor Deposition) method, for example. At this time, as a raw material of the Group III-V compound semiconductor, for example, trimethyl aluminum (TMA), trimethyl gallium (TMG), trimethyl indium (TMIn), or arsine ($AsH_3$) is used. As a raw material of a donor impurity, for example, $H_2Se$ is used. As a raw material of an acceptor impurity, for example, dimethyl zinc (DMZ) is used.

First, the lower DBR mirror layer 11, the lower cladding layer 12, the active layer 13, the upper cladding layer 14, the current confinement layer 15D, the upper DBR mirror layer 16, and the contact layer 17 are layered over the substrate 10 in this order. After that, a resist layer R1 is formed on the contact layer 17 (FIG. 10A). Only one layer of the polarization control layer 26D is provided in the upper DBR mirror layer 16.

Next, part of the contact layer 17 and the upper DBR mirror layer 16 is selectively etched by, for example, the RIE (Reactive Ion Etching) method to form the pair of trenches 25 and 25 (FIG. 10B). At this time, the trenches 25 and 25 are formed so that the bottom portions thereof reach the polarization control layer 26D, but do not reach the current confinement layer 15.

Next, after a resist layer (not shown) is formed, the portion corresponding to the light emitting aperture 24 in the contact layer 17 is removed (FIG. 11A). Subsequently, after a resist layer (not shown) is formed, part of the contact layer 17, the upper DBR mirror layer 16, the current confinement layer 15D, the upper cladding layer 14, the active layer 13, the lower cladding layer 12, and the lower DBR mirror layer 11 is selectively removed to form the mesa 19 (FIG. 11B).

Next, oxidation treatment is performed at a high temperature in the water vapor atmosphere to selectively oxidize Al in the current confinement layer 15D from outside of the mesa 19, and to selectively oxidize Al in the polarization control layer 26D from the internal wall side of the trench 25 and outside of the mesa 19 (FIGS. 12A and 12B). Thereby, the outer edge region of the current confinement layer 15D becomes the current confinement region 15B, and the central region thereof becomes the current injection region 15A. Further, the vicinity of the internal wall of the trench 25 of the polarization control layer 26D and the outer edge region of the polarization control layer 26D become the oxidation region 26B, and the region other than the oxidation region 26B becomes the non-oxidation region 26A. By concurrently oxidizing the current confinement layer 15D and the polarization control layer 26D as above, the current confinement layer 15 and the polarization control layer 26 are formed.

Next, an insulator is deposited over the entire surface by, for example, the CVD (Chemical Vapor Deposition) method.

After that, the portion corresponding to the outer edge of the top face of the mesa 19 in the layer on which the insulator is deposited is selectively removed by etching to expose the contact layer 17. Thereby, the protective film 20 is formed. If a material of the portion formed in the trench 25 in the protective film 20 is formed from a material different from a material of the other portions, for example, the following procedure is performed. That is, the portion corresponding to the outer edge of the top face of the mesa 19 in the layer on which the insulator is deposited and a portion where the insulator is deposited in the trench 25 are selectively removed to expose the contact layer 17 and the internal wall of the trench 25 (upper DBR mirror layer 16). After that, a desired material may be selectively deposited only on the internal wall of the trench 25.

Next, the metal material is layered over the entire surface by, for example, a vacuum evaporation method. After that, by etching, the portion other than (in the layer on which the metal material is deposited) the portion corresponding to the outer edge of the top face of the mesa 19, part of the side face of the mesa 19, and part of the substrate around the mesa 19 is selectively removed. Thereby, the upper electrode 21 and the pad 22 are formed, and the light emitting aperture 24 is formed on the top face of the mesa 19.

Next, the rear face of the substrate 10 is polished as appropriate and the thickness thereof is adjusted. After that, the lower electrode 23 is formed on the rear face of the substrate 10. Consequently, the VCSEL 1 is manufactured.

In the VCSEL 1 having the foregoing structure, when a given voltage is applied between the lower electrode 23 and the upper electrode 21, a current is injected into the active layer 13 through the current injection region 15A of the current confinement layer 15. Thereby, light is emitted due to electron-hole recombination. Such light is reflected by the pair of the lower DBR mirror layer 11 and the upper DBR mirror layer 16. Laser oscillation is generated at a given wavelength, and the light is emitted as a laser beam outside.

In this embodiment, in the case where the current injection region 15A is in the shape of a quadrangle having in-plane anisotropy, in the direction other than the diagonal lines of the quadrangle, the polarization component of laser light is suppressed. That is, the polarization component of laser light is polarized into the diagonal line directions and the other directions. Further, in the case where the light emitting aperture 24 is provided in the region corresponding to one diagonal line in the current injection region 15A, and the pair of trenches 25 and 25 is provided with the light emitting aperture 24 in between, the polarization component in the diagonal line direction corresponding to the light emitting aperture 24 is intensified, while the polarization component in the other diagonal line direction is suppressed. As a result, the polarization component of laser light is fixed in one direction.

Further, in this embodiment, in all or part of the plurality of low-refractive index layers in the upper DBR mirror layer 16, the polarization control layer 26 is provided instead of the low-refractive index layer. In the polarization control layer 26, as shown in FIG. 9, the oxidation region 26B is provided mainly along the side wall of the trench 25, and the non-oxidation region 26A is provided in the region other than the oxidation region 26B. That is, the oxidation region 26B is unevenly distributed in the rotational direction centering on the middle point of the pair of trenches 25 and 25 in the plane of the polarization control layer 26.

In general, when a semiconductor layer is oxidized, the volume of the oxidized portion is reduced. Thus, if the in-plane shape of the oxidized portion is unevenly distributed in the rotational direction centering on a certain region as the central region, an uneven strain according to the distribution is generated in the foregoing central region. If the semiconductor layer in which such an uneven strain is generated in the central region is layered together with the other semiconductor layers, a stress due to such an uneven strain is unevenly generated in the other semiconductor layers. If an active layer is included in the layers in which such an uneven stress is generated, light generated from a light emitting region of the active layer shows a polarization distribution according to the stress profile. Therefore, in the case where the stress has anisotropy in the light emitting region, one of the polarization component in the direction in which the stress is the maximum and the polarization component in the direction orthogonal to the direction in which the stress is the maximum is intensified, and the other polarization component is suppressed.

Meanwhile, in this embodiment, as described above, the oxidation region 26B is mainly formed along the side wall of the trench 25. Therefore, the oxidation region 26B is unevenly distributed in the rotational direction centering on the middle point of the pair of trenches 25 and 25 in the plane of the polarization control layer 26. Thus, in the central region in the plane of the polarization control layer 26, a tension strain is generated in the direction orthogonal to the opposed faces of the pair of trenches 25 and 25. A tension stress due to such a tension strain is generated in the light emitting region 13A of the active layer 13 provided adjacent to the polarization control layer 26. As a result, the polarization component in the direction orthogonal to the tension stress direction (direction parallel to the opposed faces of the pair of trenches 25 and 25) is intensified. Meanwhile, the polarization component in the direction parallel to the stress direction (direction orthogonal to the opposed faces of the pair of trenches 25 and 25) is suppressed. That is, the polarization direction intensified by the oxidation region 26B is equal to the polarization direction intensified by the current injection region 15A. Therefore, the polarization component of emitted light can be more stabilized in one direction.

Further, in this embodiment, it is not necessary to use a special substrate and to form a complicated shape and structure in the light emitting aperture 24. Thus, the device can be manufactured easily and inexpensively. Further, it is not necessary to decrease the size of the mesa 19. Therefore, it is possible to secure a large area of the current injection region 15A and the light emitting aperture 24. Thus, the resistance of the resonator including the lower DBR mirror layer 11 and the upper DBR mirror layer 16 may be lowered. In addition, the output of the laser light thereof may be increased. As a result, in this embodiment, a practical VCSEL may be obtained.

Further, in this embodiment, as described above, the pair of trenches 25 and 25 is oppositely arranged to sandwich the light emitting aperture 24 provided in the region including the region corresponding to one diagonal line of the quadrangular current confinement region 15B. Therefore, while the polarization component in the diagonal line direction corresponding to the light emitting aperture 24 is intensified, the polarization component in the other diagonal line direction is suppressed. Thereby, the polarization component of emitted light can be stabilized in one direction.

Descriptions of the invention have been hereinbefore given with reference to the embodiment. However, the invention is not limited to the foregoing embodiment, and various modifications may be made.

In the foregoing embodiment, the polarization control layer 26 is provided in all or part of the plurality of low-refractive index layers in the upper DBR mirror layer 16. However, the polarization control layer 26 may be provided in all or part of the plurality of low-refractive index layers in the lower DBR mirror layer 11. In this case, however, it is necessary that in a manufacturing step, the trench 25 is provided to at least penetrate all polarization control layers 26D provided in the lower DBR mirror layer 11. Further, it is necessary that in providing oxidation treatment for the polarization control layer 26D after the trench 25 is provided, the polarization control layer 26D is made of a semiconductor material that is oxidized more easily than the low-refractive index layer and the high-refractive index layer in the lower DBR mirror layer 11, so that the low-refractive index layer and the high-refractive index layer in the lower DBR mirror layer 11 are not oxidized more than the polarization control layer 26D.

Further, in the foregoing embodiment, the polarization control layer 26 is provided in the upper DBR mirror layer 16. However, the polarization control layer 26 may be provided between the upper cladding layer 14 and the upper DBR mirror layer 16, or may be provided between the lower cladding layer 12 and the lower DBR mirror layer 11.

Further, in the foregoing embodiment, the polarization control layer 26 is arranged so that the distance of the polarization control layer 26 from the active layer 13 is longer than the distance of the current confinement layer 15 from the active layer 13. However, the polarization control layer 26 may be arranged so that the distance of the polarization control layer 26 from the active layer 13 is shorter than the distance of the current confinement layer 15 from the active layer 13.

Further, in the foregoing embodiment, the polarization control layer 26 is provided apart from the current confinement layer 15. However, the polarization control layer 26 may be contacted with the current confinement layer 15.

Further, in the foregoing embodiment, the current confinement layer 15 is provided between the upper cladding layer 14 and the upper DBR mirror layer 16. However, the current confinement layer 15 may be provided between the lower cladding layer 12 and the lower DBR mirror layer 11, or may be provided in the upper DBR mirror layer 16 or in the lower DBR mirror layer 11.

Figure 13:
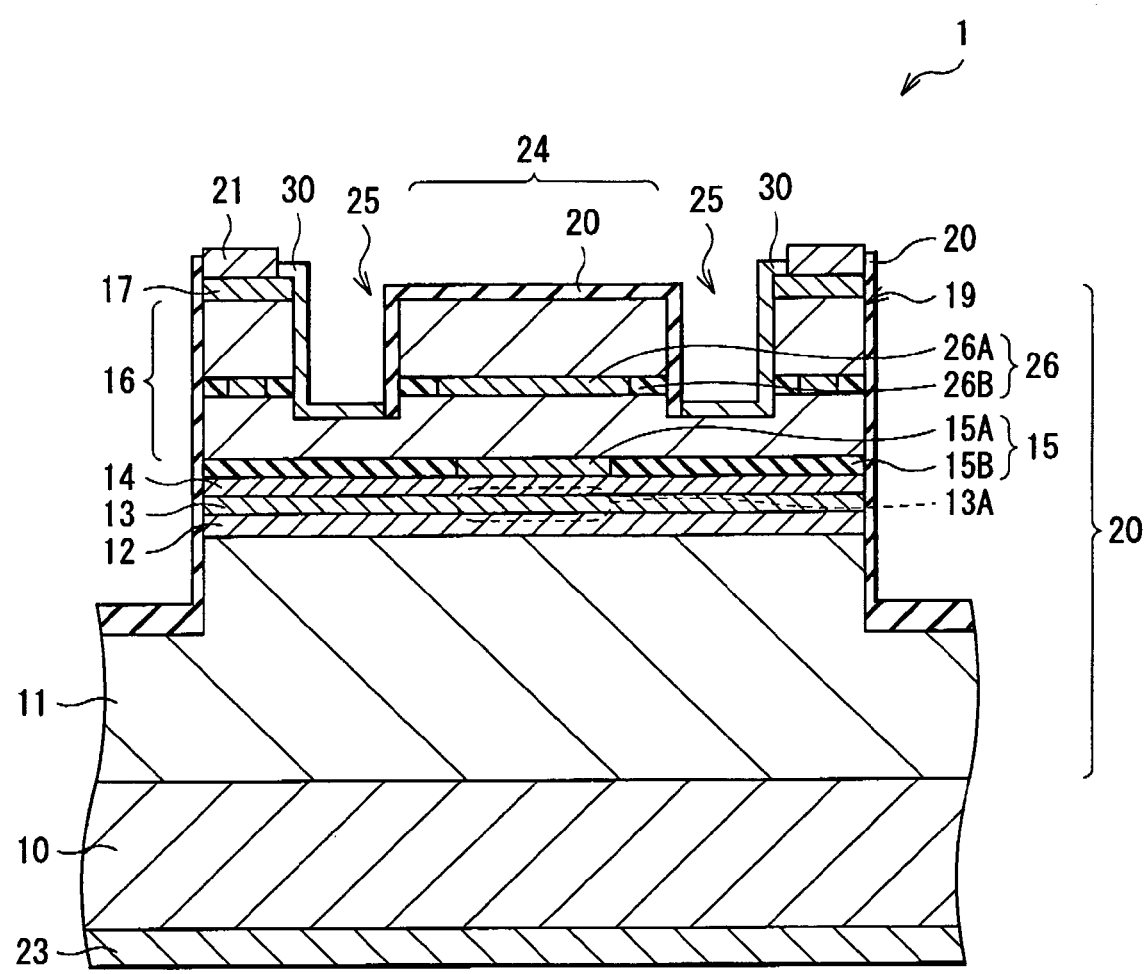
FIG. 13 is a view showing a cross sectional structure taken along arrows B-B of a VCSEL according to another modification.

Further, in the foregoing embodiment, the description has been given of the case in which polarization control is performed by forming the polarization control layer 26 along the internal wall of the trench 25. However, as shown in FIG. 13, it is possible that a polarization control layer 30 can be provided in all or part of the internal face of the trench 25 together with the current confinement layer 15 and the polarization control layer 26, and polarization control can be performed with the use of the multiplier effect of these 3 layers. Further, in the case where the current confinement layer 15 is circular, as described above, and the polarization control layer 26 is not provided, that is, a layer capable of polarization control is not provided in the semiconductor layer structure 18, polarization control can be performed by providing the polarization control layer 30 in all or part of the internal face of the trench 25.

Figure 14:
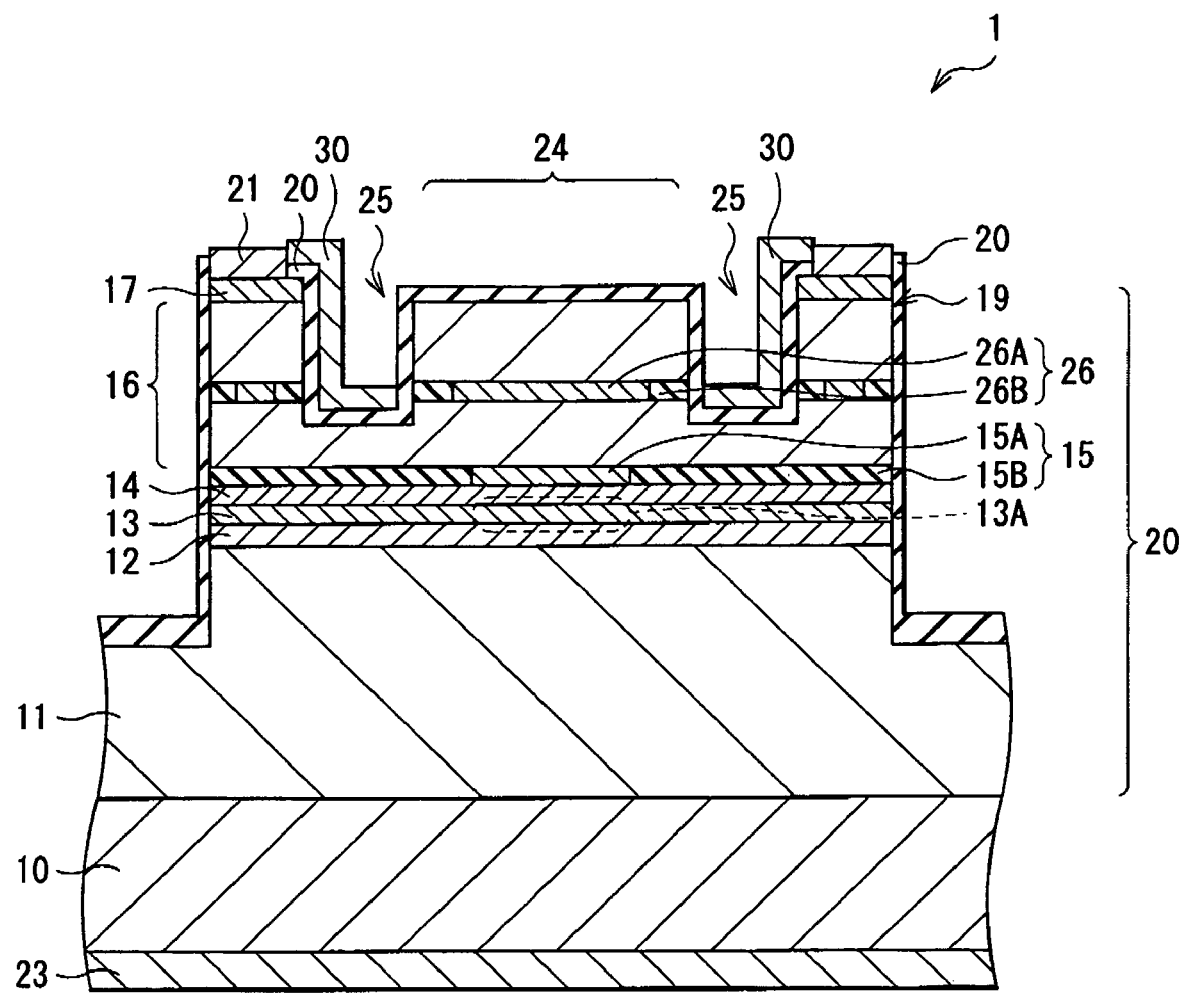
FIG. 14 is a view showing a cross sectional structure taken along arrows B-B of a VCSEL according to still another modification.

The polarization control layer 30 may be directly contacted with the internal wall of the trench 25, as shown in FIG. 13. Otherwise, the polarization control layer 30 may be provided for the internal wall of the trench 25 with the protective film 20 in between, as shown in FIG. 14.

For example, in the case of using an oxide (silicon oxide or the like) or a nitride (silicon nitride or the like) as a material of the polarization control layer 30, a compression strain may be generated in the polarization control layer 26 by appropriately adjusting the manufacturing conditions. In the case of using a metal material (such as gold (Au), platinum (Pt), nickel (Ni), gold germanium (AuGe), gold zinc (AuZn), chromium gold (CrAu), titanium (Ti), or aluminum (Al)) as the material thereof, a compression strain is generated in the portion where such a metal material is used.

Figure 15:
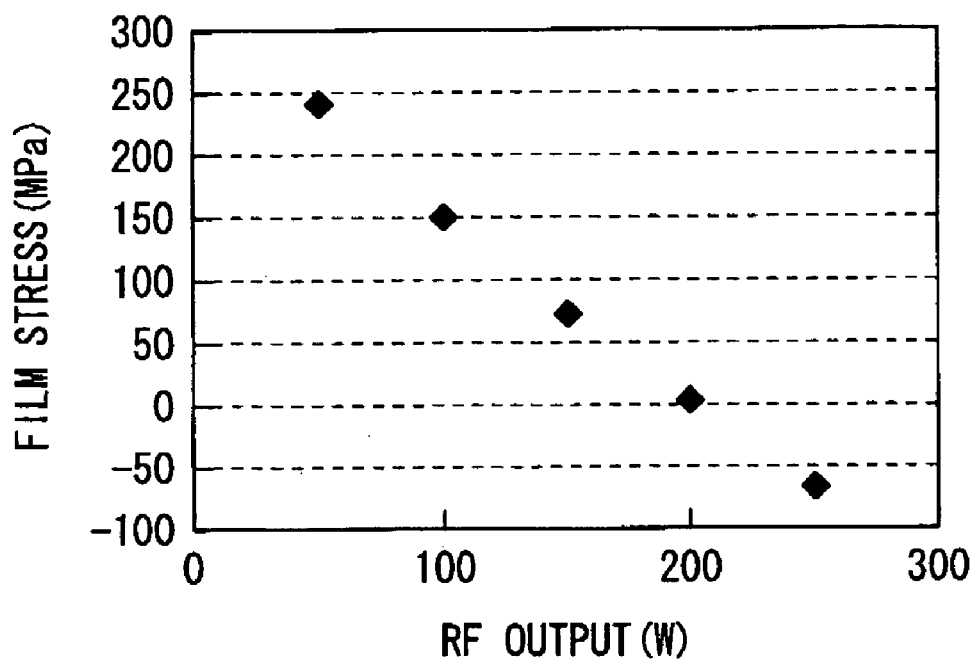
FIG. 15 is a relation diagram showing a relation between a RF output and stress in the case in which a polarization control layer in a trench is made of SiN.
Figure 16:
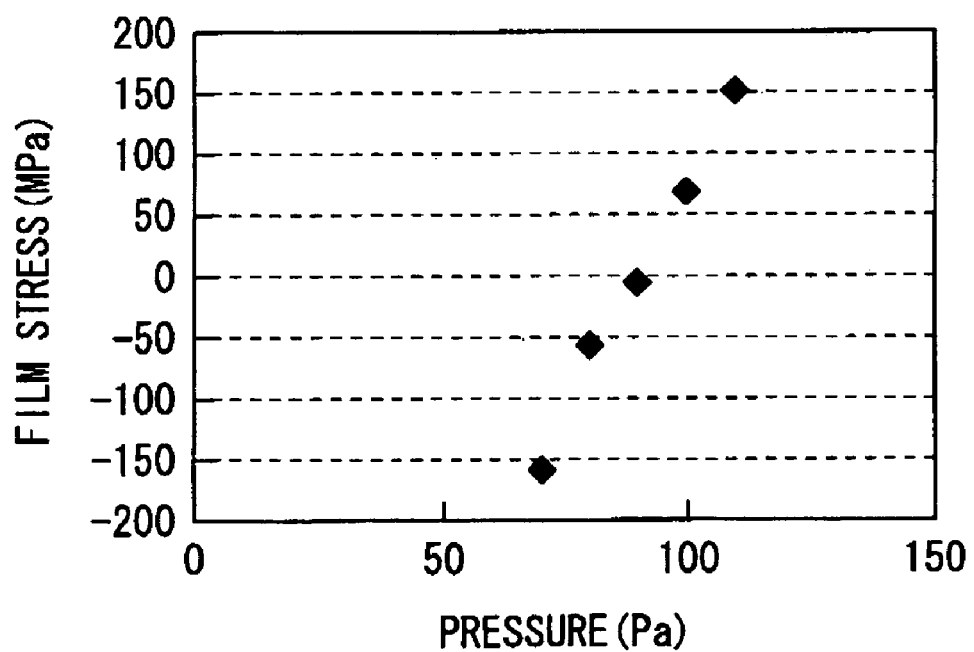
FIG. 16 is a relation diagram showing a relation between pressure and stress in the case in which a polarization control layer in a trench is made of SiN.
Figure 17:
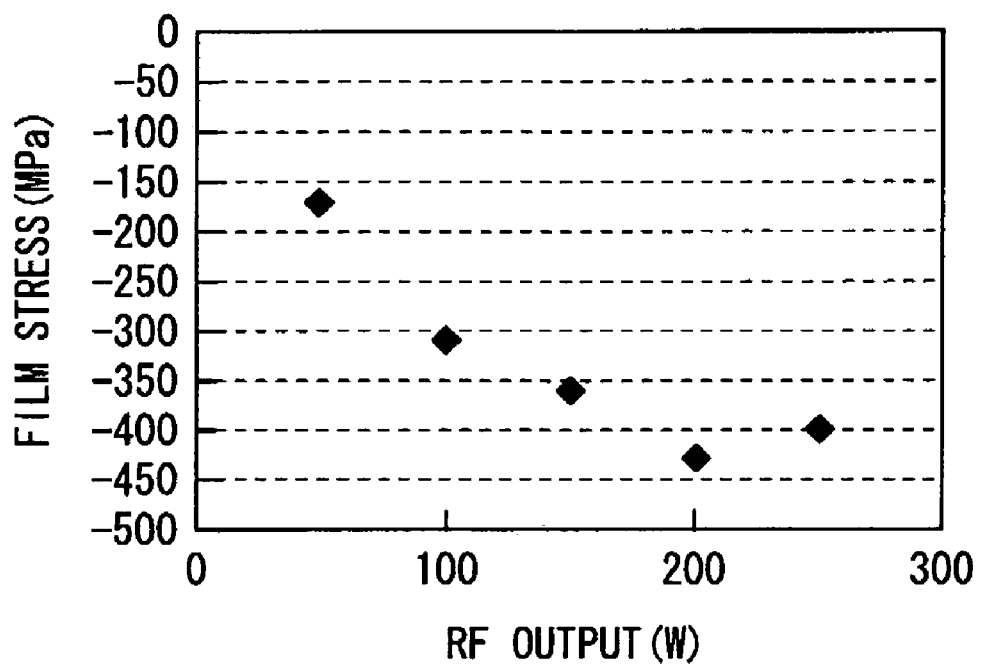
FIG. 17 is a relation diagram showing a relation between a RF output and stress in the case in which a polarization control layer in a trench is made of $SiO_2$.
Figure 18:
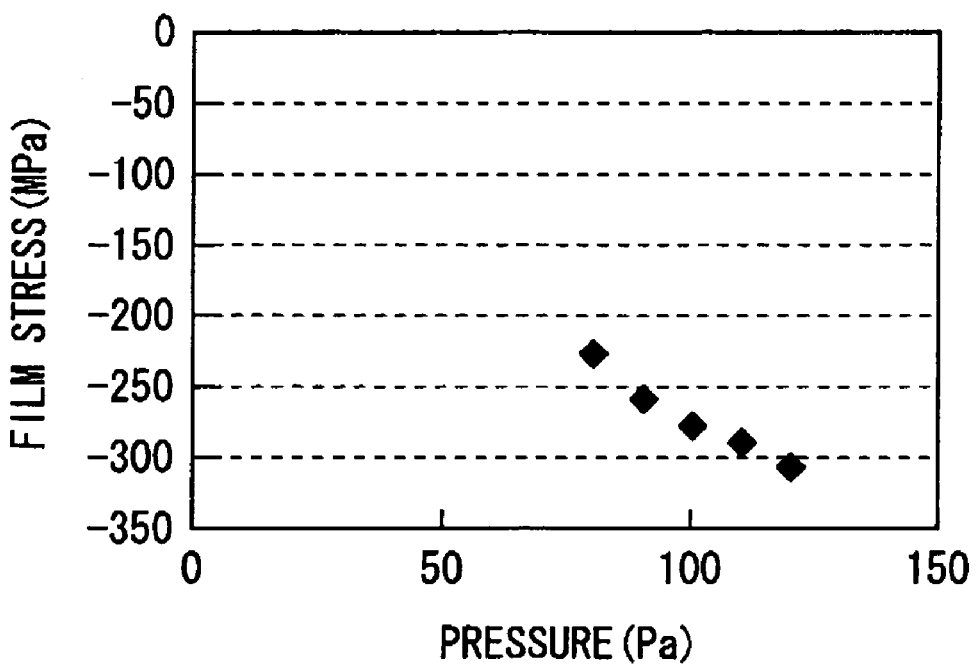
FIG. 18 is a relation diagram showing a relation between pressure and stress in the case in which a polarization control layer in a trench is made of $SiO_2$.

Specific examples of a relation between a manufacturing condition and a stress value in the case in which SiN or $SiO_2$ was used as a material for covering the internal wall of the trench 25 are shown in FIG. 15, FIG. 16, FIG. 17, and FIG. 18. FIG. 15 shows a relation between an RF output and a stress of an SiN film in the case in which SiN was deposited for 8 minutes in a state where 120 sccm of 20% $SiH_4$ diluted with $N_2$, 50 sccm of $NH_3$, and 20 sccm of $N_2$ were poured into a vacuum chamber, the temperature in the vacuum chamber was set to 350 deg C., and the pressure was 110 Pa. FIG. 16 shows a relation between a pressure and a stress of an SiN film in the case in which SiN was deposited under the same gas mixture condition, the temperature, and the time as those of FIG. 15. FIG. 17 shows a relation between a RF output and a stress of a $SiO_2$ film in the case in which $SiO_2$ was deposited for 4 minutes in a state in which 50 sccm of 20% $SiH_4$ diluted with $N_2$, 140 sccm of $N_2O$, and 410 sccm of $N_2$ were poured into a vacuum chamber, the temperature in the vacuum chamber was set to 350 deg C., and the pressure was 120 Pa. FIG. 18 shows a relation between a pressure and a stress of a $SiO_2$ film in the case in which $SiO_2$ was deposited under the same gas mixture condition, temperature, and time as those of FIG. 17. In FIG. 15, FIG. 16, FIG. 17, and FIG. 18, a stress value in the case of a compression stress is expressed as minus, and a stress value in the case of a tension stress is expressed as plus.

By appropriately adjusting the manufacturing conditions and selecting a metal material as described above, a compression strain is generated in the polarization control layer 30. Thereby, a tension stress may be generated in the light emitting region 13A of the active layer 13 provided adjacent to the polarization control layer 30. As a result, the polarization component in the direction orthogonal to the tension stress direction (direction parallel to the opposed faces of the pair of trenches 25 and 25) is intensified. Meanwhile, the polarization component in the direction parallel to the stress direction (direction orthogonal to the opposed faces of the pair of trenches 25 and 25) is suppressed. That is, the polarization direction intensified by the polarization control layer 30 is equal to the polarization direction intensified by the current injection region 15A and the polarization control layer 26. Therefore, in the case in which the current injection region 15A has the shape anisotropy, as described above, the polarization control layer 26 is provided, and the polarization control layer 30 is further provided, the polarization component of emitted light may be more stabilized in one direction by the multiplier effect of the 3 factors. Further, even in the case in which the current injection region layer 15A is circular and the polarization control layer 26 is not provided, the polarization component of emitted light may be more stabilized in one direction by providing the polarization control layer 30.

Further, in the foregoing embodiments, the invention has been described with reference to the AlGaAs-based compound semiconductor laser. However, the invention also can be applied to other compound semiconductor lasers, such as a GaInP-based semiconductor laser, an AlGaInP-based semiconductor laser, an InGaAs-based semiconductor laser, a GaInP-based semiconductor laser, an InP-based semiconductor laser, a GaN-based semiconductor laser, a GaInN-based semiconductor laser, and a GaInNAs-based semiconductor laser.

It should be understood by those skilled in the art that various modifications, combinations, subcombinations and alternations may occur depending on design requirements and other factors insofar as they are within the scope of the appended claims or the equivalents thereof.

What is claimed is:

1. A Vertical Cavity Surface Emitting Laser comprising:
a semiconductor lamination structure including a first multilayer film reflector, an active layer having a light emitting region, and a second multilayer film reflector in this order over a substrate from the substrate side, wherein the semiconductor lamination structure has
a pair of grooves provided with a region opposed to the light emitting region in between,
one or a plurality of first oxidation layers including a first non-oxidation region provided at least in a region opposed to the light emitting region and a first oxidation region provided on each side face of the pair of grooves, and
one or a plurality of second oxidation layers including a second non-oxidation region provided in a region opposed to the light emitting region and a second oxidation region provided in a region not opposed to the light emitting region wherein the second oxidation layer is formed in a layer in which the grooves are not formed.

2. The Vertical Cavity Surface Emitting Laser according to claim 1, wherein a width of a portion between the first oxidation regions in the first non-oxidation region is equal to or larger than a width of the second non-oxidation region.

3. The Vertical Cavity Surface Emitting Laser according to claim 1, wherein the first oxidation layer contains a semiconductor material is more prone to oxidation than the first multilayer film reflector and the second multilayer film reflector.

4. The Vertical Cavity Surface Emitting Laser according to claim 1, wherein the first oxidation layer contains a semiconductor material is less prone to oxidation than the second oxidation layer.

5. The Vertical Cavity Surface Emitting Laser according to claim 1, wherein the second non-oxidation region is in the shape of a quadrangle in which an intersection of diagonal lines corresponds to the light emitting region, and
the pair of grooves is oppositely arranged in a direction parallel to an extending direction of one diagonal line of the second non-oxidation region.

6. The Vertical Cavity Surface Emitting Laser according to claim 1, wherein a width of the second non-oxidation region is smaller than a width between opposing faces of the pair of grooves.

7. The Vertical Cavity Surface Emitting Laser according to claim 1, wherein a bottom face of the groove is formed in the second multilayer film reflector.

8. The Vertical Cavity Surface Emitting Laser according to claim 1, wherein the first multilayer film reflector and the second multilayer film reflector are respectively formed by alternately layering a low-refractive index layer and a high-refractive index layer, and
the first oxidation layer is formed in all or part of a plurality of low-refractive index layers included in at least one of the first multilayer film reflector and the second multilayer film reflector.

9. The Vertical Cavity Surface Emitting Laser according to claim 1, wherein the first oxidation layer is formed between the active layer and at least one of the first multilayer film reflector and the second multilayer film reflector.

10. A Vertical Cavity Surface Emitting Laser comprising:
a semiconductor lamination structure including a first multilayer film reflector, an active layer having a light emitting region, and a second multilayer film reflector in this order over a substrate from the substrate side, wherein the semiconductor lamination structure has a pair of grooves provided with a region opposed to the light emitting region in between,
one or a plurality of first oxidation layers including a first non-oxidation region provided at least in a region opposed to the light emitting region and a first oxidation region provided on each side face of the pair of grooves, and
one or a plurality of second oxidation layers including a second non-oxidation region provided in a region opposed to the light emitting region and a second oxidation region provided in a region not opposed to the light emitting region,
wherein the first multilayer film reflector and the second multilayer film reflector are respectively formed by alternately layering a low-refractive index layer and a high-refractive index layer, and
the second oxidation layer is formed in at least one of a plurality of low-refractive index layers included in at least one of the first multilayer film reflector and the second multilayer film reflector.

11. The Vertical Cavity Surface Emitting Laser according to claim 1, wherein the second oxidation layer is formed between the active layer and at least one of the first multilayer film reflector and the second multilayer film reflector.

12. The Vertical Cavity Surface Emitting Laser according to claim 1, wherein the second oxidation layer is formed closer to the active layer side than the first oxidation layer is.

13. A Vertical Cavity Surface Emitting Laser comprising:
a semiconductor lamination structure including a first multilayer film reflector, an active layer having a light emitting region, and a second multilayer film reflector in this order over a substrate from the substrate side, wherein the semiconductor lamination structure has
a pair of grooves provided with a region opposed to the light emitting region in between,
one or a plurality of first oxidation layers including a first non-oxidation region provided at least in a region opposed to the light emitting region and a first oxidation region provided on each side face of the pair of grooves, and
an insulating layer that is provided in all or part of an internal wall of the groove, and gives a tension stress in an opposing direction of the pair of grooves to a region opposed to the light emitting region in the semiconductor lamination structure.

14. A Vertical Cavity Surface Emitting Laser comprising:
a semiconductor lamination structure including a first multilayer film reflector, an active layer having a light emitting region, and a second multilayer film reflector in this order over a substrate from the substrate side, wherein the semiconductor lamination structure has
a pair of grooves provided with a region opposed to the light emitting region in between,
one or a plurality of first oxidation layers including a first non-oxidation region provided at least in a region opposed to the light emitting region and a first oxidation region provided on each side face of the pair of grooves, and
a metal layer that is provided in all or part of an internal wall of the groove, and gives a tension stress in an opposing direction of the pair of grooves to a region opposed to the light emitting region in the semiconductor lamination structure.

15. A Vertical Cavity Surface Emitting Laser comprising:
a semiconductor lamination structure including a first multilayer film reflector, an active layer having a light emitting region, and a second multilayer film reflector in this order over a substrate from the substrate side; and a metal layer, wherein the semiconductor lamination structure has a pair of grooves provided with a region opposed to the light emitting region in between, and the metal layer is provided in all or part of an internal wall of the groove, and gives a tension stress in an opposing direction of the pair of grooves to the light emitting region.

16. A method of manufacturing a Vertical Cavity Surface Emitting Laser comprising the steps of:

forming a mesa having a pair of grooves by forming a semiconductor lamination structure including one or a plurality of first oxidized layers over a substrate, and then forming the pair of grooves penetrating the first oxidized layer and forming the semiconductor lamination structure in a shape of a mesa; and forming a first oxidation region on an internal wall side of the groove in the first oxidized layer and forming a first non-oxidation region at least between opposing faces of the pair of grooves in the first oxidized layer by oxidizing the first oxidized layer at least from the internal wall side of the groove, wherein the semiconductor layer lamination structure includes one or a plurality of second oxidized layers, the groove has a depth penetrating the first oxidized layer and not reaching the second oxidized layer, and a step of forming a second oxidation region on a side wall side of the mesa in the second oxidized layer and forming a second non-oxidation region in a region surrounded by the second oxidation region in the second oxidized layer by oxidizing the second oxidized layer from the side wall side of the mesa is included.

17. The method of manufacturing a Vertical Cavity Surface Emitting Laser according to claim 16, wherein the first oxidized layer and the second oxidized layer are concurrently oxidized.

18. The Vertical Cavity Surface Emitting Laser according to claim 10, wherein a width of a portion between the first oxidation regions in the first non-oxidation region is equal to or larger than a width of the second non-oxidation region.

19. The Vertical Cavity Surface Emitting Laser according to claim 10, wherein the first oxidation layer contains a semiconductor material is more prone to oxidation than the first multilayer film reflector and the second multilayer film reflector.

20. The Vertical Cavity Surface Emitting Laser according to claim 10, wherein the first oxidation layer contains a semiconductor material is less prone to oxidation than the second oxidation layer.

21. The Vertical Cavity Surface Emitting Laser according to claim 10, wherein the second non-oxidation region is in the shape of a quadrangle in which an intersection of diagonal lines corresponds to the light emitting region, and the pair of grooves is oppositely arranged in a direction parallel to an extending direction of one diagonal line of the second non-oxidation region.

22. The Vertical Cavity Surface Emitting Laser according to claim 10, wherein a width of the second non-oxidation region is smaller than a width between opposing faces of the pair of grooves.

23. The Vertical Cavity Surface Emitting Laser according to claim 10, wherein a bottom face of the groove is formed in the second multilayer film reflector.

24. The Vertical Cavity Surface Emitting Laser according to claim 10, wherein the first multilayer film reflector and the second multilayer film reflector are respectively formed by alternately layering a low-refractive index layer and a high-refractive index layer, and the first oxidation layer is formed in all or part of a plurality of low-refractive index layers included in at least one of the first multilayer film reflector and the second multilayer film reflector.

25. The Vertical Cavity Surface Emitting Laser according to claim 10, wherein the first oxidation layer is formed between the active layer and at least one of the first multilayer film reflector and the second multilayer film reflector.

26. The Vertical Cavity Surface Emitting Laser according to claim 10, wherein the second oxidation layer is formed between the active layer and at least one of the first multilayer film reflector and the second multilayer film reflector.

27. The Vertical Cavity Surface Emitting Laser according to claim 10, wherein the second oxidation layer is formed closer to the active layer side than the first oxidation layer is.

28. The Vertical Cavity Surface Emitting Laser according to claim 13, wherein a width of a portion between the first oxidation regions in the first non-oxidation region is equal to or larger than a width of the second non-oxidation region.

29. The Vertical Cavity Surface Emitting Laser according to claim 13, wherein a bottom face of the groove is formed in the second multilayer film reflector.

30. The Vertical Cavity Surface Emitting Laser according to claim 13, wherein the first multilayer film reflector and the second multilayer film reflector are respectively formed by alternately layering a low-refractive index layer and a high-refractive index layer, and the first oxidation layer is formed in all or part of a plurality of low-refractive index layers included in at least one of the first multilayer film reflector and the second multilayer film reflector.

31. The Vertical Cavity Surface Emitting Laser according to claim 13, wherein the first oxidation layer is formed between the active layer and at least one of the first multilayer film reflector and the second multilayer film reflector.

32. The Vertical Cavity Surface Emitting Laser according to claim 14, wherein a width of a portion between the first oxidation regions in the first non-oxidation region is equal to or larger than a width of the second non-oxidation region.

33. The Vertical Cavity Surface Emitting Laser according to claim 14, wherein a bottom face of the groove is formed in the second multilayer film reflector.

34. The Vertical Cavity Surface Emitting Laser according to claim 14, wherein the first multilayer film reflector and the second multilayer film reflector are respectively formed by alternately layering a low-refractive index layer and a high-refractive index layer, and the first oxidation layer is formed in all or part of a plurality of low-refractive index layers included in at least one of the first multilayer film reflector and the second multilayer film reflector.

35. The Vertical Cavity Surface Emitting Laser according to claim 14, wherein the first oxidation layer is formed between the active layer and at least one of the first multilayer film reflector and the second multilayer film reflector.

* * * * *